(12) United States Patent
Yoo

(10) Patent No.: US 12,010,903 B2
(45) Date of Patent: Jun. 11, 2024

(54) LAMINATION APPARATUS AND METHOD OF MANUFACTURING DISPLAY DEVICE USING THE SAME

(71) Applicant: Samsung Display Co., Ltd., Yongin-si (KR)

(72) Inventor: Kisang Yoo, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 20 days.

(21) Appl. No.: 17/865,511

(22) Filed: Jul. 15, 2022

(65) Prior Publication Data

US 2023/0078185 A1    Mar. 16, 2023

(30) Foreign Application Priority Data

Sep. 15, 2021   (KR) .................. 10-2021-0123398

(51) Int. Cl.
| | |
|---|---|
| *B32B 41/00* | (2006.01) |
| *B32B 37/00* | (2006.01) |
| *B32B 37/10* | (2006.01) |
| *H10K 71/00* | (2023.01) |
| *H10K 50/84* | (2023.01) |
| *H10K 59/122* | (2023.01) |

(52) U.S. Cl.
CPC .......... *H10K 71/00* (2023.02); *B32B 37/0046* (2013.01); *B32B 37/1018* (2013.01); *B32B 41/00* (2013.01); *B32B 2309/68* (2013.01); *B32B 2457/20* (2013.01); *H10K 50/841* (2023.02); *H10K 59/122* (2023.02)

(58) Field of Classification Search
CPC .... H10K 71/00; H10K 50/841; H10K 59/122; H10K 59/873; B32B 37/0046; B32B 37/1018; B32B 41/00; B32B 2309/68; B32B 2457/20; G06F 1/1637; G06F 1/1652; G06F 1/1656
USPC ................... 156/60, 64, 350, 351, 378, 379
See application file for complete search history.

(56) References Cited

U.S. PATENT DOCUMENTS

| | | | |
|---|---|---|---|
| 10,315,400 B2 | 6/2019 | Son et al. | |
| 10,500,820 B2 | 12/2019 | Lee et al. | |
| 2014/0002973 A1* | 1/2014 | Lee | H05K 13/022 361/679.01 |
| 2017/0069879 A1* | 3/2017 | Um | H10K 71/00 |
| 2018/0086034 A1* | 3/2018 | Lee | B32B 38/0004 |

FOREIGN PATENT DOCUMENTS

| | | |
|---|---|---|
| KR | 20050098671 A | 10/2005 |
| KR | 101701247 B1 | 2/2017 |
| KR | 20180034737 A | 4/2018 |

* cited by examiner

*Primary Examiner* — Michael N Orlando
*Assistant Examiner* — Joshel Rivera
(74) *Attorney, Agent, or Firm* — CANTOR COLBURN LLP

(57) ABSTRACT

A lamination apparatus includes a first jig which includes an accommodating recess defined by a bottom surface through which a plurality of vacuum holes is defined and side surfaces bent and extending from the bottom surface, a cover member that does not overlap at least one vacuum hole among the plurality of vacuum holes, a second jig disposed to face the first jig, a pad disposed on the second jig, and a controller which sets zero data based on a vacuum value measured from the at least one vacuum hole.

20 Claims, 21 Drawing Sheets

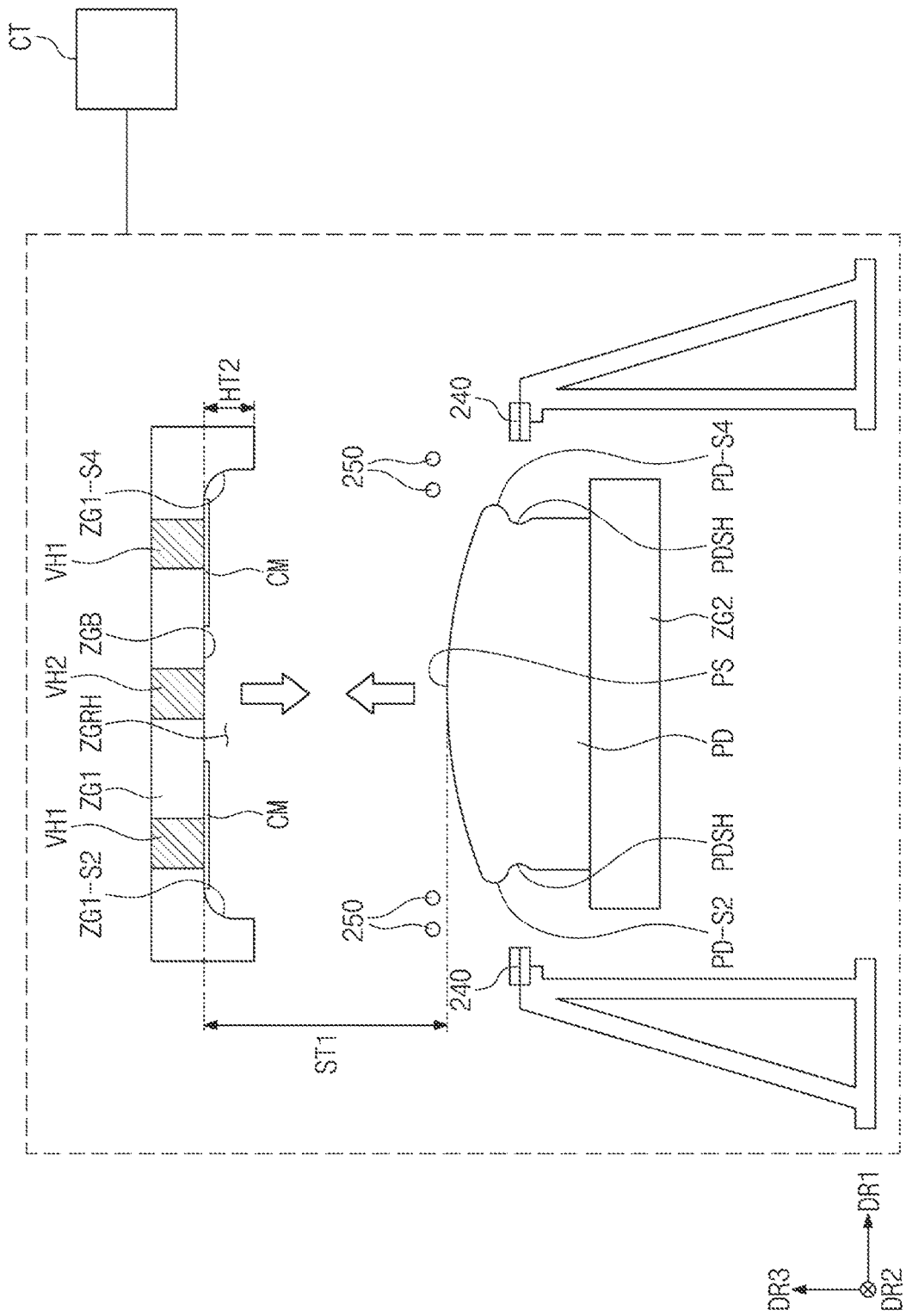

LAMINATION APPARATUS AND METHOD OF MANUFACTURING DISPLAY DEVICE USING THE SAME

This application claims priority to Korean Patent Application No. 10-2021-0123398, filed on Sep. 15, 2021, and all the benefits accruing therefrom under 35 U.S.C. § 119, the content of which in its entirety is herein incorporated by reference.

BACKGROUND

1. Field

Embodiments of the invention relate to a lamination apparatus providing zero data and a method of manufacturing a display device using the same.

2. Description of the Related Art

A display device includes a window and a display panel. The window protects the display panel and is attached to the display panel by an adhesive. A lamination apparatus is used to laminate the window and the display panel.

SUMMARY

Embodiments of the invention provide a lamination apparatus providing zero data. Embodiments of the invention provide a method of manufacturing a display device using the lamination apparatus.

An embodiment of the invention provides a lamination apparatus including a first jig including an accommodating recess defined by a bottom surface through which a plurality of vacuum holes is defined and side surfaces bent and extending from the bottom surface, a cover member that does not overlap at least one vacuum hole among the plurality of vacuum holes, a second jig disposed to face the first jig, a pad disposed on the second jig, and a controller that sets zero data based on a vacuum value measured from the at least one vacuum hole.

In an embodiment, the second jig may ascend in a first direction until the pad contacts the at least one vacuum hole, and the controller may set information about a position of the first jig and a position of the second jig when the pad contacts the at least one vacuum hole as the zero data.

In an embodiment, the plurality of vacuum holes may include a first vacuum hole that overlaps the cover member and a second vacuum hole that does not overlap the cover member, and the controller may set the zero data based on the vacuum value measured in the second vacuum hole.

In an embodiment, the pad may include a protruded upper surface, and the second vacuum hole may contact the protruded portion of the pad.

In an embodiment, the cover member may include a tape, and the tape may be attached to remaining vacuum holes of the plurality of vacuum holes except the vacuum hole among the vacuum holes.

In an embodiment, the cover member may be a setting window through which an opening is defined, the setting window may be attached to the bottom surface of the first jig, and the at least one vacuum hole may overlap the opening and may not be covered by the setting window.

In an embodiment, the controller may control a movement of the first and second jigs, control an operation of the plurality of vacuum holes, and control a measurement of vacuum values from the plurality of vacuum holes.

In an embodiment, the controller may include a processor that measures the vacuum values from the at least one vacuum hole and generates a plurality of data based on the vacuum values and a determinator that resets the zero data based on the data.

In an embodiment, the controller may further include a memory that stores the vacuum value and vacuum saturation data, and the vacuum value may be measured multiple times according to a relative position between the first jig and the pad, and the vacuum saturation data may be the vacuum value obtained when the vacuum values measured multiple times have constantly a same value.

In an embodiment, the memory may further store vacuum reference data, and the vacuum reference data may be obtained by correcting the vacuum saturation data with a predetermined value.

In an embodiment, the memory may further store a Z-axis value, the Z-axis value may be a height value of an upper surface of the pad when the vacuum value is changed from a value corresponding to the vacuum reference data to another value.

In an embodiment, the memory may further store the zero data, and the zero data may be the Z-axis value or a corrected Z-axis value obtained by correcting the Z-axis value.

An embodiment of the invention provides a method of manufacturing a display device. The method includes setting zero data of a lamination apparatus and laminating a first target member to a second target member using the lamination apparatus. The setting the zero data of the lamination apparatus includes attaching a cover member to a first jig through which a plurality of vacuum holes is defined to expose at least one vacuum hole among the plurality of vacuum holes, moving a second jig facing the first jig and a pad disposed on the second jig toward the plurality of vacuum holes, and setting the zero data based on a vacuum value measured from the at least one vacuum hole.

In an embodiment, the cover member may include a tape, and the attaching the cover member may include attaching the tape to remaining vacuum holes except the at least one vacuum hole among the plurality of vacuum holes.

In an embodiment, the cover member may be a setting window through which an opening is defined, and the attaching the cover member may include aligning the setting window such that the opening the setting window overlaps the at least one vacuum hole and attaching the setting window to a bottom surface of the first jig.

In an embodiment, the setting the zero data may include generating vacuum reference data based on the vacuum value measured from the at least one vacuum hole and generating a Z-axis value based on the vacuum reference data.

In an embodiment, the method may further include setting the Z-axis value or a corrected Z-axis value obtained by correcting the Z-axis value as the zero data, and the Z-axis value may be a height value of an upper surface of the pad when the vacuum value is changed from a value corresponding to the vacuum reference data to another value.

In an embodiment, the generating the vacuum reference data may include measuring the vacuum value multiple times when a distance between the first jig and the pad is equal to or smaller than a predetermined distance, setting the measured value as vacuum saturation data when the vacuum values measured multiple times have constantly the same value, and correcting the vacuum saturation data with a predetermined value to generate the vacuum reference data.

In an embodiment, the generating the Z-axis value may include performing a first moving operation to move the second jig to a first direction until the vacuum value becomes a value corresponding to the vacuum reference data, performing a second moving operation following the first moving operation to move the second jig to the first direction until the vacuum value is changed from the value corresponding to the vacuum reference data to another value, and generating a height value of an upper surface of the pad as the Z-axis value when the vacuum value is changed from the value corresponding to the vacuum reference data to another value.

In an embodiment, a moving speed of the second jig in the first moving operation may be different from a moving speed of the second jig in the second moving operation.

According to the above, even though a lamination target is changed or the shape of the pad is changed due to the repeated use of the pad, the zero data (or a zero value) are reset based on the vacuum value. The zero data are automatically set by the controller of the lamination apparatus, and since the operation of components in the lamination apparatus is systematically performed, a management accuracy for the zero data is improved. That is, the lamination apparatus is automatically set based on the vacuum value. Accordingly, an error of a setting value, for example, the zero data, is reduced, and a time desired to set the lamination apparatus is reduced compared with a time desired when the lamination apparatus is set manually. In addition, it is possible to correct the Z-axis value by reflecting the change in height of the pad caused by the repeated use of the pad.

In addition, as the zero data are set based on the vacuum value, the error of the zero data is reduced. Accordingly, defects related to the degree of pressure, e.g., a panel crack, a gray spot, a bubble, etc., is reduced or removed.

BRIEF DESCRIPTION OF THE DRAWINGS

The above and other advantages of the invention will become readily apparent by reference to the following detailed description when considered in conjunction with the accompanying drawings, in which:

FIGS. 4B and 4C are cross-sectional views of an embodiment of a lamination apparatus according to the invention;

DETAILED DESCRIPTION

Figure 1:
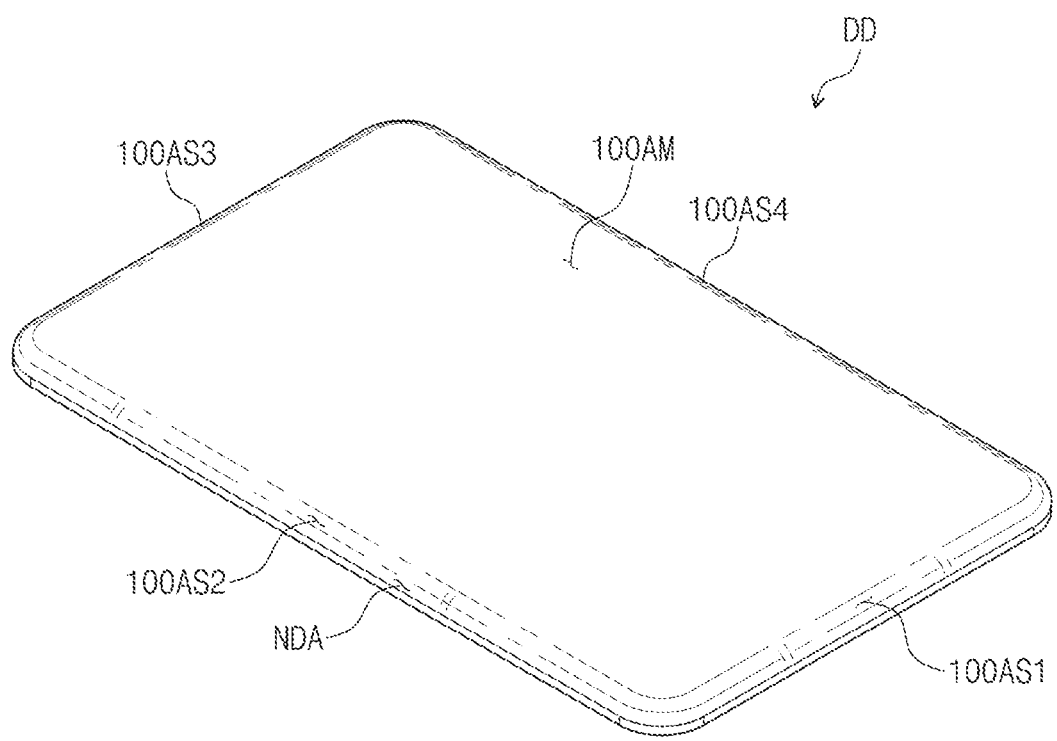
FIG. 1 is a perspective view of an embodiment of a display device according to the invention.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc., may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

The term "part" or "unit" as used herein is intended to mean a software component or a hardware component that performs a specific function. The hardware component may include, for example, a field-programmable gate array ("FPGA") or an application-specific integrated circuit ("ASIC"). The software component may refer to an executable code and/or data used by the executable code in an addressable storage medium. Thus, the software components may be, for example, object-oriented software components, class components, and task components, and may include processes, functions, attributes, procedures, subroutines, segments of program code, drivers, firmware, micro codes, circuits, data, a database, data structures, tables, arrays, or variables.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is a perspective view of an embodiment of a display device DD according to the invention.

Referring to FIG. 1, the display device DD may be a device activated in response to an electrical signal. The display device DD may be a mobile phone, a tablet computer, a car navigation device, a game device, or a wearable device, however, it should not be particularly limited.

The display device DD may include a display surface DS defined by a first direction DR1 and a second direction DR2 crossing the first direction DR1. The display device DD may provide an image to a user through the display surface DS.

The display surface DS may include a display area DA and a non-display area NDA defined around the display area DA. The display area DA may display the image, and the non-display area NDA may not display the image. The non-display area NDA may surround the display area DA, however, it should not be limited thereto or thereby. The display area DA and the non-display area NDA may be changed in shape.

The display surface DS may include a main display area 100AM and first, second, third, and fourth sub-display areas 100AS1, 100AS2, 100AS3, and 100AS4.

The main display area 100AM may be substantially parallel to a plane defined by the first direction DR1 and the second direction DR2. A third direction DR3 perpendicular to a plane defined by the first direction DR1 and the second direction DR2 may be defined as a thickness direction of the display device DD. In addition, in the following descriptions, an expression "in a plan view" may mean a state of being viewed in the third direction DR3. In an embodiment, the main display area 100AM may have a concave or convex shape with respect to the plane defined by the first direction DR1 and the second direction DR2.

The first, second, third, and fourth sub-display areas 100AS1, 100AS2, 100AS3, and 100AS4 may be bent from the main display area 100AM. The main display area 100AM and the first, second, third, and fourth sub-display areas 100AS1, 100AS2, 100AS3, and 100AS4 may be defined adjacent to each other to form a continuous display area. Each of the first, second, third, and fourth sub-display areas 100AS1, 100AS2, 100AS3, and 100AS4 may be bent from the main display area 100AM and may have a predetermined curvature. The curvatures of the first, second, third, and fourth sub-display areas 100AS1, 100AS2, 100AS3, and 100AS4 may be the same as each other or may be different from each other.

The first sub-display area 100AS1 and the third sub-display area 100AS3 may extend in the first direction DR1 and may be spaced apart from each other with the main display area 100AM interposed therebetween in the second direction DR2. The second sub-display area 100AS2 and the fourth sub-display area 100AS4 may extend in the second direction DR2 and may be spaced apart from each other with the main display area 100AM interposed therebetween in the first direction DR1.

The display device DD shown in FIG. 1 includes one main display area 100AM and four sub-display areas, e.g., the first, second, third, and fourth sub-display areas 100AS1, 100AS2, 100AS3, and 100AS4, however, the invention should not be limited thereto or thereby. In an embodiment, the display device DD may include one main display area 100AM and some sub-display areas of the first, second, third, and fourth sub-display areas 100AS1, 100AS2, 100AS3, and 100AS4.

Figure 2:
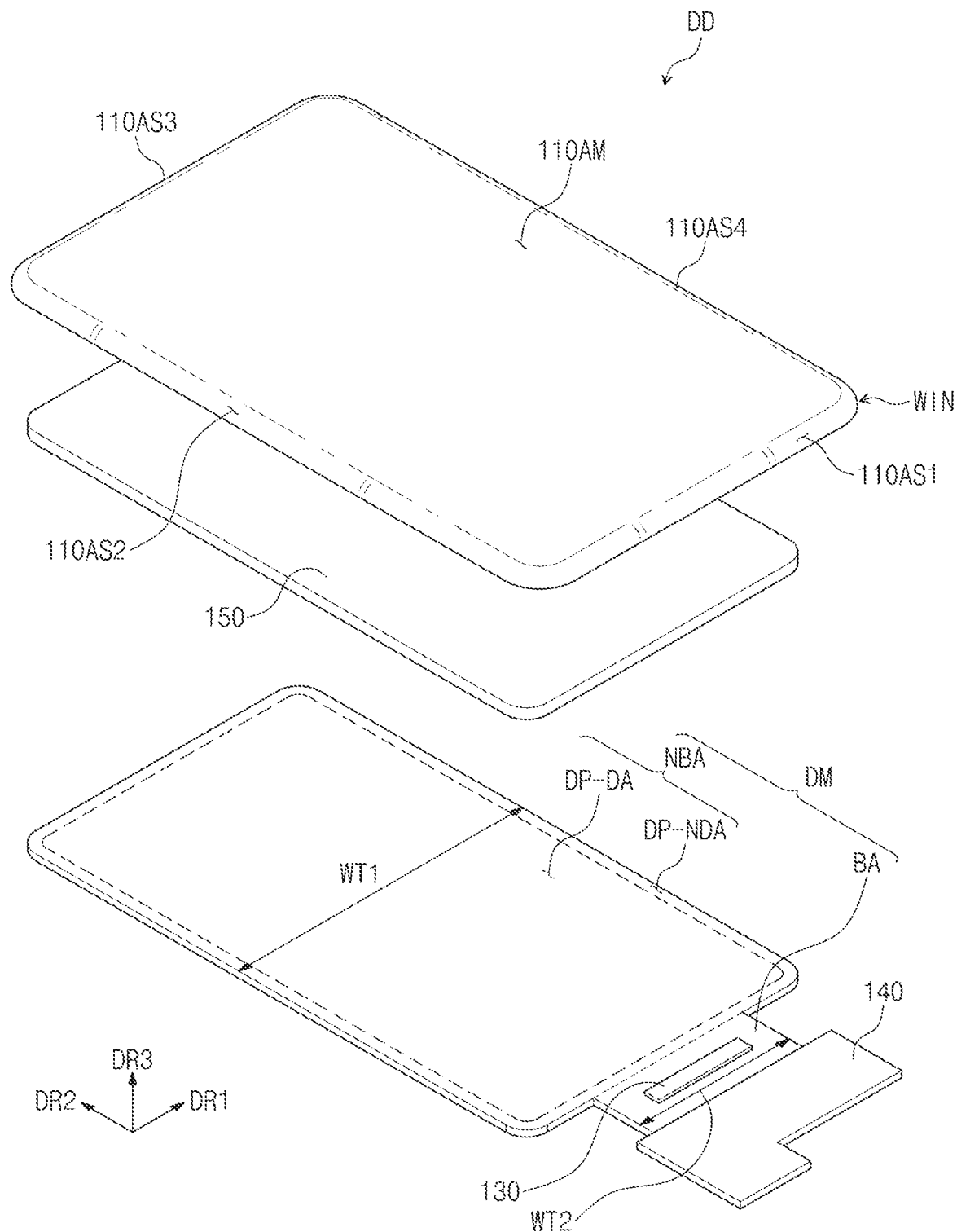
FIG. 2 is an exploded perspective view of an embodiment of a display device according to the invention.

FIG. 2 is an exploded perspective view of an embodiment of the display device DD according to the invention.

Referring to FIG. 2, the display device DD may include a window WIN, an adhesive layer 150, a display module DM, a driving chip 130, and a main circuit board 140.

A front surface of the window WIN may define the display surface DS (refer to FIG. 1) of the display device DD. The window WIN may include an optically transparent insulating material. In an embodiment, the window WIN may include glass or plastic. The window WIN may have a single-layer or multi-layer structure. In an embodiment, the window WIN may include a plurality of plastic films attached to each other by an adhesive or may include a glass substrate and a plastic film attached to the glass substrate by an adhesive, for example.

The window WIN may include a main transmission surface 110AM and first, second, third, and fourth side transmission surfaces 110AS1, 110AS2, 110AS3, and 110AS4 bent from and extending from the main transmission surface 110AM. Each of the first, second, third, and fourth side transmission surfaces 110AS1, 110AS2, 110AS3, and 110AS4 may have a predetermined curvature. The curvatures of the first, second, third, and fourth side transmission surfaces 110AS1, 110AS2, 110AS3, and 110AS4 may be the same as each other or may be different from each other, however, they should not be limited thereto or thereby. In an embodiment, the first, second, third, and fourth side transmission surfaces 110AS1, 110AS2, 110AS3, and 110AS4 may be a flat surface.

The first side transmission surface 110AS1 and the third side transmission surface 110AS3 may extend in the first direction DR1 and may be spaced apart from each other with the main transmission surface 110AM interposed therebetween in the second direction DR2. The second side transmission surface 110AS2 and the fourth side transmission surface 110AS4 may extend in the second direction DR2 and may be spaced apart from each other with the main transmission surface 110AM interposed therebetween in the first direction DR1.

The window WIN may overlap a non-bending area NBA of the display module DM. That is, the non-bending area NBA may be attached to the main transmission surface 110AM and the first, second, third, and fourth side transmission surfaces 110AS1, 110AS2, 110AS3, and 110AS4.

A bending area BA that is not attached to the window may be bent toward a rear surface of the non-bending area NBA. The driving chip 130 may be disposed in the bending area BA, and the main circuit board 140 may be attached to the bending area BA. The driving chip 130 may be a timing control circuit in the form of a chip, however, this is merely one example. In an embodiment, the driving chip 130 may be disposed (e.g., mounted) on a separate film from the display module DM. In this case, the driving chip 130 may be electrically connected to the display module DM through the film.

The adhesive layer 150 may be disposed under the window WIN and may combine the window WIN with the display module DM. The window WIN may be combined with the display module DM using a lamination apparatus LMD (refer to FIG. 4B). In an embodiment, the adhesive layer 150 may be a transparent adhesive member, such as a pressure sensitive adhesive ("PSA") film, an optically clear adhesive ("OCA") film, or an optically clear resin ("OCR").

The display module DM may be disposed under the adhesive layer 150. The display module DM may include the non-bending area NBA and the bending area BA. The non-bending area NBA and the bending area BA may be adjacent to each other in the second direction DR2. The bending area BA may be a portion extending and protruded from the non-bending area NBA in a direction substantially parallel to the second direction DR2, and the bending area BA and the non-bending area NBA may have a continuous shape or a unitary shape. A width WT1 in the first direction DR1 of the non-bending area NBA may be greater than a width WT2 in the first direction DR1 of the bending area BA.

The non-bending area NBA of the display module DM may include a display area DP-DA and a non-display area DP-NDA. The non-display area DP-NDA may surround the display area DP-DA. The display area DP-DA and the non-display area DP-NDA of the display module DM may overlap a display area DA and a non-display area NDA of the window WIN, respectively. The image may be provided to the window WIN through the display area DP-DA.

Although not shown in drawing figures, the display device DD may further include a protective member disposed under the display module DM. The protective member disposed under the display module DM may protect the display module DM from external impacts. The protective member may include a plurality of layers. In an embodiment, the protective member may include a light shielding layer, a heat dissipation layer, a cushion layer, and a plurality of adhesive layers, for example.

The light shielding layer may improve a phenomenon in which components disposed at a rear side of the display module DM are viewed. Although not shown in drawing figures, the light shielding layer may include a binder and a plurality of pigment particles dispersed in the binder. The pigment particles may include a carbon black.

The heat dissipation layer may effectively dissipate heat generated by the display module DM. The heat dissipation layer may include a metal plate having excellent dissipation characteristics. In an embodiment, the heat dissipation layer may include at least one of stainless steel, graphite, copper (Cu), and aluminum (Al), however, it should not be particularly limited. The heat dissipation layer may improve the heat dissipation characteristics and may also have electromagnetic wave shielding characteristics or electromagnetic wave absorption characteristics.

Figure 3A:
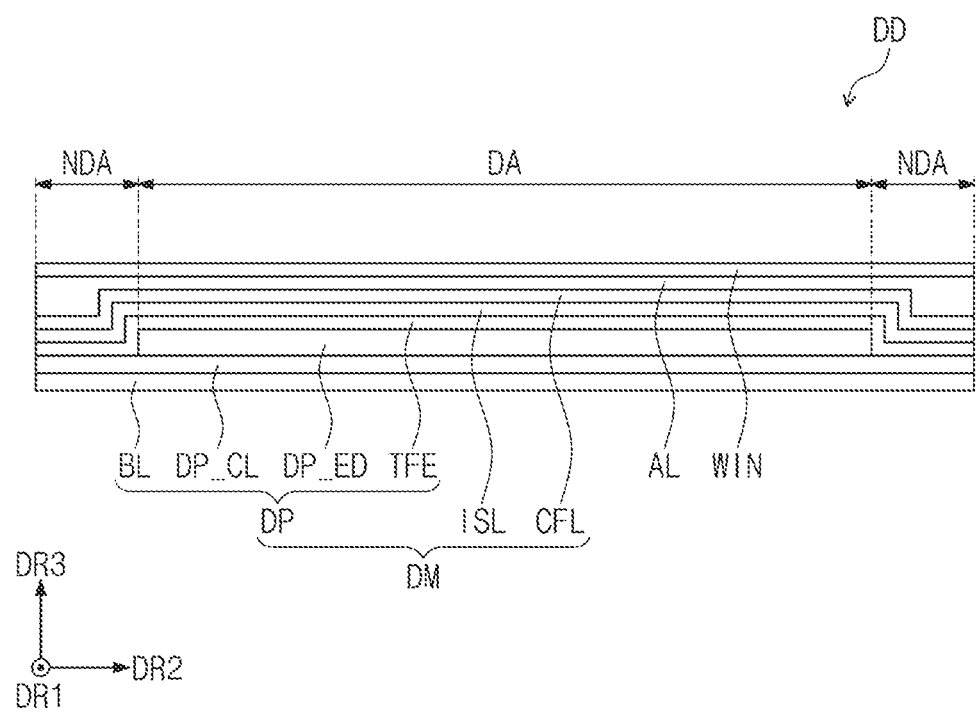
FIG. 3A is a cross-sectional view of an embodiment of a display device according to the invention.

The cushion layer may be a synthetic resin foam. The cushion layer may include a matrix member and a plurality of pores. The pores may be distributed and defined in the matrix member. In an embodiment, the cushion layer may be disposed under the heat dissipation layer. The cushion layer may have an elasticity and may have a porous structure. FIG. 3A is a cross-sectional view of an embodiment of the display device DD according to the invention.

Referring to FIG. 3A, the display device DD may include the window WIN and the display module DM. The display module DM may include a display panel DP, an input sensing layer ISL, and an anti-reflective layer CFL.

The display panel DP may have a configuration that substantially generates the image. The display panel DP may be a light-emitting type display panel. In an embodiment, the display panel DP may be an organic light-emitting display layer, an inorganic light-emitting display layer, an organic-inorganic light-emitting display layer, a quantum dot display layer, a micro-light-emitting diode ("micro-LED") display layer, or a nano-LED display layer, for example.

The input sensing layer ISL may be disposed on the display panel DP. The input sensing layer ISL may sense an external input applied thereto from the outside. The external input may be a user input. In an embodiment, the user input may include a variety of external inputs, such as a part of user's body, light, heat, pen, or pressure.

The input sensing layer ISL may be formed or disposed on the display panel DP through successive processes. In this case, the input sensing layer ISL may be disposed directly on the display panel DP. In the invention, the expression "the input sensing layer ISL is disposed directly on the display panel DP" means that no intervening elements are between the input sensing layer ISL and the display panel DP. That is, a separate adhesive member may not be disposed between the input sensing layer ISL and the display panel DP. In an embodiment, the input sensing layer ISL may be coupled to the display panel DP by an adhesive member. The adhesive member may include an ordinary adhesive.

The anti-reflective layer CFL may be disposed on the input sensing layer ISL. The anti-reflective layer CFL may reduce a reflectance with respect to an external light incident to the display device DD from the outside. The anti-reflective layer CFL may be formed or disposed on the input sensing layer ISL through successive processes. The anti-reflective layer CFL may include color filters. The color filters may be arranged in a predetermined arrangement. The arrangement of the color filters may be determined by taking into account colors of lights emitted from pixels included in the display panel DP. In addition, the anti-reflective layer CFL may further include a black matrix adjacent to the color filters. In an embodiment, the anti-reflective layer CFL may include a polarizing film, and the polarizing film may include a retarder and a polarizer. In an alternative embodiment, the anti-reflective layer CFL may be omitted.

In an embodiment, the display device DD may further include an adhesive layer AL. The window WIN may be attached to the anti-reflective layer CFL by the adhesive layer AL. In an embodiment, the adhesive layer AL may include an OCA, an OCR, or a PSA.

Figure 3B:
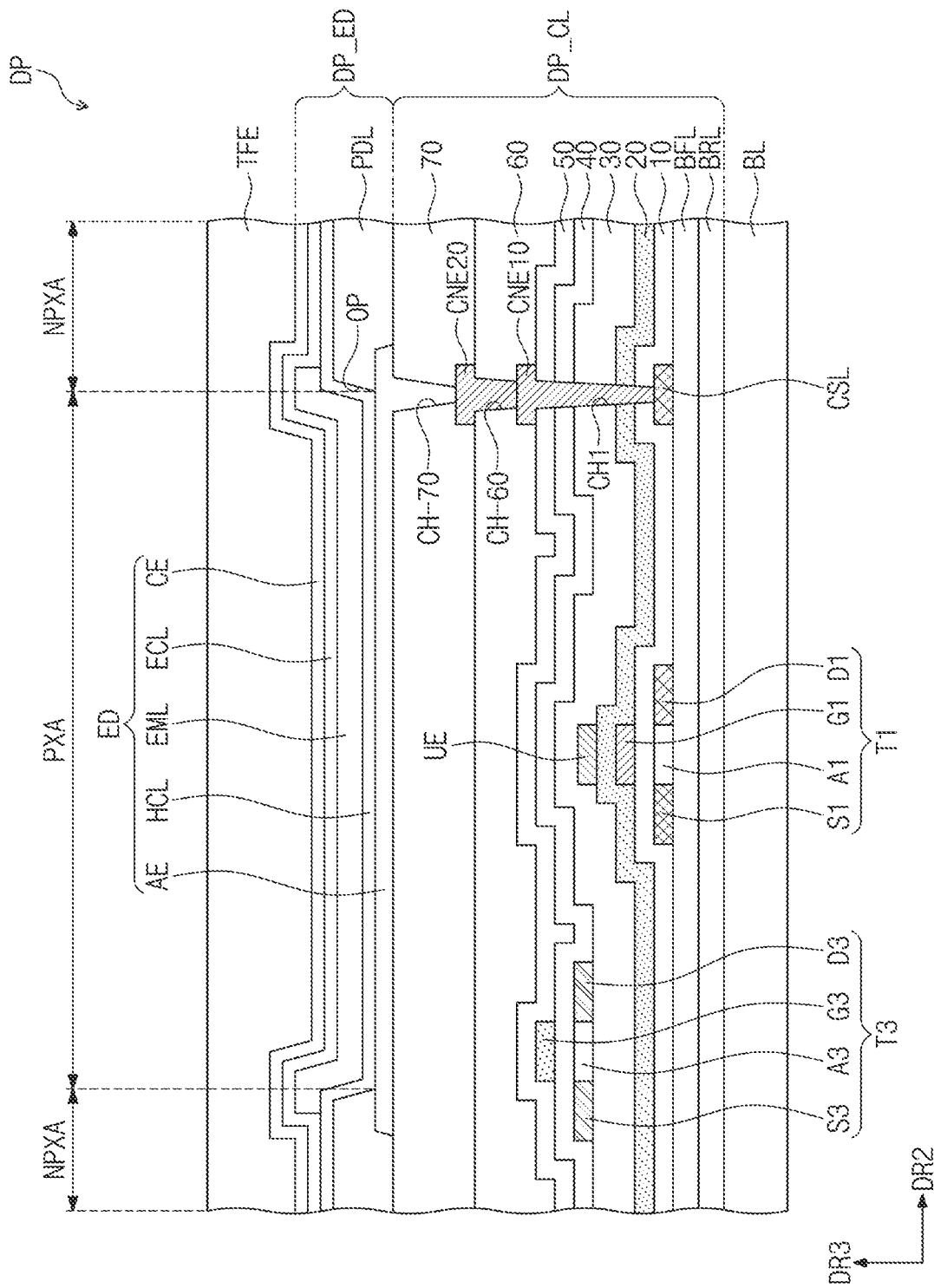
FIG. 3B is a cross-sectional view of an embodiment of a display panel according to the invention.

FIG. 3B is a cross-sectional view of the display panel DP according to the invention.

Referring to FIG. 3B, the display panel DP may include a base layer BL, a circuit layer DP_CL, an element layer DP_ED, and an encapsulation layer TFE. The circuit layer DP_CL, the element layer DP_ED, and the encapsulation layer TFE may be disposed on the base layer BL.

The base layer BL may be a member that provides a base surface on which the circuit layer DP_CL is disposed. The base layer BL may be a flexible substrate that is bendable, foldable, or rollable. The base layer BL may be a glass substrate, a metal substrate, or a polymer substrate, however, it should not be limited thereto or thereby. In an embodiment, the base layer BL may be an inorganic layer, an organic layer, or a composite material layer.

The base layer BL may have a multi-layer structure. For instance, the base layer BL may include a first synthetic resin layer, an intermediate layer having a single-layer or multi-layer structure, and a second synthetic resin layer disposed on the intermediate layer. The intermediate layer may be also referred to as a base barrier layer. The intermediate layer may include a silicon oxide (SiOx) layer and an amorphous silicon (a-Si) layer disposed on the silicon oxide layer, however, it should not be particularly limited. In an embodiment, the intermediate layer may include at least one of a silicon oxide layer, a silicon nitride layer, a silicon oxynitride layer, and an amorphous silicon layer.

Each of the first and second synthetic resin layers may include a polyimide-based resin. In addition, each of the first and second synthetic resin layers may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In the disclosure, the term "X-based resin", as used herein, refers to the resin that includes a functional group of X. At least one inorganic layer may be disposed on an upper surface of the base layer BL. The inorganic layer may include at least one of aluminum oxide, titanium oxide, silicon oxide, silicon oxynitride, zirconium oxide, and hafnium oxide. The inorganic layer may be formed or provided in multiple layers. The inorganic layers may form a barrier layer BRL and/or a buffer layer BFL. In an embodiment, the buffer layer BFL and the barrier layer BRL may be selectively disposed on the base layer BL.

The barrier layer BRL may prevent a foreign substance from entering from the outside. The barrier layer BRL may include a silicon oxide layer and a silicon nitride layer. Each of the silicon oxide layer and the silicon nitride layer may be provided in plural, and the silicon oxide layers may be alternately stacked with silicon nitride layers.

The buffer layer BFL may be disposed on the barrier layer BRL. The buffer layer BFL may increase a coupling force between the base layer BL and a semiconductor pattern or between the base layer BL and a conductive pattern. In an embodiment, the buffer layer BFL may include a silicon oxide layer and a silicon nitride layer. The silicon oxide layer and the silicon nitride layer may be alternately stacked with each other.

The semiconductor pattern may be disposed on the buffer layer BFL. Hereinafter, the semiconductor pattern disposed directly on the buffer layer BFL may be defined as a first semiconductor pattern. The first semiconductor pattern may include a silicon semiconductor. The first semiconductor pattern may include polysilicon, however, it should not be limited thereto or thereby. In an embodiment, the semiconductor pattern may include amorphous silicon.

FIG. 3B shows a portion of the first semiconductor pattern disposed on the buffer layer BFL, and the first semiconductor pattern may be further disposed in other areas of the pixel. The first semiconductor pattern may be arranged with a predetermined pattern over the pixels. The first semiconductor pattern may have different electrical properties depending on whether it is doped or not or whether it is doped with an N-type dopant or a P-type dopant. The first semiconductor pattern may include a first region with high conductivity and a second region with low conductivity. The first region may be doped with the N-type dopant or the P-type dopant. A P-type transistor may include a doped region doped with the P-type dopant, and an N-type transistor may include a doped region doped with the N-type dopant. The second region may be a non-doped region or may be doped at a concentration lower than that of the high conductivity region.

The first region may have a conductivity greater than that of the second region and may substantially serve as an electrode or signal line. The second region may substantially correspond to an active area (or a channel) of a transistor. In other words, a portion of the semiconductor pattern may be the active area of the transistor, another portion of the semiconductor pattern may be a source or a drain of the transistor, and the other portion of the semiconductor pattern may be a connection electrode or a connection signal line. As shown in FIG. 3B, a first electrode S1, a channel portion A1, and a second electrode D1 of the first transistor T1 may be formed or provided from the first semiconductor pattern. The first electrode S1 and the second electrode D1 of the first transistor T1 may extend in opposite directions to each other from the channel portion A1.

FIG. 3B shows a portion of a connection signal line CSL formed or provided from the semiconductor pattern. Although not shown in drawing figures, the connection signal line CSL may be connected to a second electrode of another transistor forming the pixel circuit.

A first insulating layer 10 may be disposed on the buffer layer BFL. The first insulating layer 10 may commonly overlap the pixels and may cover the first semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon nitride, silicon oxynitride, zirconium oxide, and hafnium oxide. In the illustrated embodiment, the first insulating layer 10 may have a single-layer structure of a silicon oxide layer. Not only the first insulating layer 10, but also an insulating layer of the circuit layer DP_CL described later may be an inorganic layer and/or an organic layer and may have a single-layer or multi-layer structure. The inorganic layer may include at least one of the above-mentioned materials, however, it should not be limited thereto or thereby.

A third electrode G1 of the first transistor T1 may be disposed on the first insulating layer 10. The third electrode G1 may be a portion of a first conductive pattern. The third electrode G1 of the first transistor T1 may overlap the channel portion A1. The third electrode G1 of the first transistor T1 may be used as a mask in a process of doping the first semiconductor pattern.

A second insulating layer 20 may be disposed on the first insulating layer 10 and may cover the third electrode G1 of the first transistor T1. The second insulating layer 20 may be an inorganic layer and/or an organic layer and may have a single-layer or multi-layer structure. The second insulating layer 20 may include at least one of silicon oxide, silicon nitride, and silicon oxynitride. In the illustrated embodiment, the second insulating layer 20 may have a multi-layer structure of a silicon oxide layer and a silicon nitride layer.

A third insulating layer 30 may be disposed on the second insulating layer 20. The third insulating layer 30 may have a single-layer structure or a multi-layer structure. In an embodiment, the third insulating layer 30 may have the multi-layer structure of a silicon oxide layer and a silicon nitride layer. An upper electrode UE of a storage capacitor may be disposed between the second insulating layer 20 and the third insulating layer 30. In addition, a lower electrode (e.g., third electrode G1 of the first transistor T1) of the storage capacitor may be disposed between the first insulating layer 10 and the second insulating layer 20.

In an embodiment, the second insulating layer 20 may be replaced with an insulating pattern. The upper electrode UE may be disposed on the insulating pattern. The upper electrode UE may serve as a mask in a process of patterning the second insulating layer 20 to form the insulating pattern. In this case, the insulating pattern may have substantially the same shape as that of the upper electrode UE.

In an embodiment, a second semiconductor pattern may be disposed on the third insulating layer 30. The second semiconductor pattern may include an oxide semiconductor.

The oxide semiconductor may include a plurality of areas distinguished from each other depending on whether a metal oxide is reduced. An area (hereinafter, also referred to as a reduced area) in which the metal oxide is reduced has a conductivity greater than that of an area (hereinafter, also referred to as a non-reduced area) in which the metal oxide is not reduced. The reduced area may substantially act as the source/drain of the transistor or the signal line. The non-reduced area may substantially correspond to the active area (or the semiconductor area or the channel) of the transistor. In other words, a portion of the second semiconductor pattern may be the active area of the transistor, another portion of the second semiconductor pattern may be the source area/drain area of the transistor, and the other portion of the second semiconductor pattern may be a signal transmission area.

As shown in FIG. 3B, a first electrode S3, a channel portion A3, and a second electrode D3 of a third transistor T3 may be formed or provided from the second semiconductor pattern. The first electrode S3 and the second electrode D3 may include a metal material reduced from a metal oxide semiconductor. The first electrode S3 and the second electrode D3 may include a metal layer having a predetermined thickness on an upper surface of the second semiconductor pattern and including the reduced metal material.

A fourth insulating layer 40 may be disposed on the third insulating layer 30. The fourth insulating layer 40 may commonly overlap the pixels and may cover the second semiconductor pattern. The fourth insulating layer 40 may include at least one of aluminum oxide, titanium oxide, silicon oxide, silicon nitride, silicon oxynitride, zirconium oxide, and hafnium oxide.

A third electrode G3 of the third transistor T3 may be disposed on the fourth insulating layer 40. The third electrode G3 may be a portion of a third conductive pattern. The third electrode G3 of the third transistor T3 may overlap the channel portion A3 of the third transistor T3. The third electrode G3 of the third transistor T3 may be used as a mask in a process of doping the second semiconductor pattern.

In an embodiment, the fourth insulating layer 40 may be replaced with an insulating pattern. The third electrode G3 of the third transistor T3 may be disposed on the insulating pattern. In this case, the insulating pattern may have substantially the same shape as that of the third electrode G3 in a plan view. In the illustrated embodiment, for the convenience of explanation, one third electrode G3 is shown, however, the third transistor T3 may include two third electrodes.

A fifth insulating layer 50 may be disposed on the fourth insulating layer 40 and may cover the third electrode G3 of the third transistor T3. The fifth insulating layer 50 may be an inorganic layer and/or an organic layer and may have a single-layer or multi-layer structure. In an embodiment, the fifth insulating layer 50 may include a silicon oxide layer and a silicon nitride layer. The fifth insulating layer 50 may include a plurality of silicon oxide layers and a plurality of silicon nitride layers alternately stacked with the silicon oxide layers.

A first connection electrode CNE10 may be disposed on the fifth insulating layer 50. The first connection electrode CNE10 may be connected to the connection signal line CSL via a contact hole CH1 defined through the first, second, third, fourth, and fifth insulating layers 10, 20, 30, 40, and 50.

A sixth insulating layer 60 may be disposed on the fifth insulating layer 50. A second connection electrode CNE20 may be disposed on the sixth insulating layer 60. The second connection electrode CNE20 may be connected to the first connection electrode CNE10 via a contact hole CH-60 defined through the sixth insulating layer 60. A seventh insulating layer 70 may be disposed on the sixth insulating layer 60 and may cover the second connection electrode CNE20.

Each of the sixth insulating layer 60 and the seventh insulating layer 70 may be an organic layer. In an embodiment, each of the sixth insulating layer 60 and the seventh insulating layer 70 may include a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenolic group, an acrylic-based polymer, an imide-based polymer, an aryl ether-based polymer, an amide-based polymer, a fluorine-based polymer, a p-xylene-based polymer, a vinyl alcohol-based polymer, or blends thereof.

The element layer DP_ED may include a light-emitting element ED and a pixel definition layer PDL. The light-emitting element ED may include an anode AE, a hole control layer HCL, a light-emitting layer EML, an electron control layer ECL, and a cathode CE.

The anode AE may be disposed on the seventh insulating layer 70. The anode AE may be connected to the second connection electrode CNE20 via a contact hole CH-70 defined through the seventh insulating layer 70. The anode AE may be a semi-transmissive electrode, a transmissive electrode, or a reflective electrode. In an embodiment, the anode AE may include a reflective layer including Ag, Mg, Al, Pt, Pd, Au, Ni, Nd, Ir, Cr, or a combination thereof and a transparent or semi-transparent electrode layer formed or disposed on the reflective layer. The transparent or semi-transparent electrode layer may include at least one selected from the group including indium tin oxide ("ITO"), indium zinc oxide ("IZO"), indium gallium zinc oxide ("IGZO"), zinc oxide (ZnO), indium oxide (In2O3), and aluminum-doped zinc oxide ("AZO"). For instance, the anode AE may include a stack structure of ITO/Ag/ITO.

The pixel definition layer PDL may be disposed on the seventh insulating layer 70. The pixel definition layer PDL may have a light absorbing property. In an embodiment, the pixel definition layer PDL may have a black color. The pixel definition layer PDL may include a black coloring agent. The black coloring agent may include a black dye or a black pigment. In an embodiment, the black coloring agent may include a carbon black, an aniline black, a metal material such as chromium, or oxides thereof. The pixel definition layer PDL may be formed or provided by mixing a blue organic material with a black organic material. The pixel definition layer PDL may further include a liquid-repellent organic material. At least a portion of the anode AE of the light-emitting element ED may be exposed through an opening OP of the pixel definition layer PDL. A light-emitting area PXA may be defined by the opening OP of the pixel definition layer PDL. For instance, the pixels may be arranged in a predetermined pattern in the display panel DP (refer to FIG. 3A) in a plan view. Areas in which the pixels are arranged may be defined as pixel areas, one pixel area may include the light-emitting area PXA and a non-light-emitting area NPXA adjacent to the light-emitting area PXA. The non-light-emitting area NPXA may surround the light-emitting area PXA.

The hole control layer HCL may be commonly disposed over the light-emitting area PXA and the non-light-emitting area NPXA. A common layer such as the hole control layer HCL may be commonly formed or disposed over the pixels PX. The hole control layer HCL may include a hole transport layer and a hole injection layer.

The light-emitting layer EML may be disposed on the hole control layer HCL. The light-emitting layer EML may be disposed only in an area corresponding to the opening OP. The light-emitting layer EML may be divided into a plurality of portions, and the portions of the light-emitting layer EML may be respectively disposed in the pixels PX.

In the illustrated embodiment, the patterned light-emitting layer EML is shown, however, the light-emitting layer EML may be commonly disposed over the pixels PX. In this case, the light-emitting layer EML may generate a white light or a blue light. In addition, the light-emitting layer EML may have a multi-layer structure.

The electron control layer ECL may be disposed on the light-emitting layer EML. The electron control layer ECL may include an electron transport layer and an electron injection layer. The cathode CE of the light-emitting element ED may be disposed on the electron control layer ECL. The electron control layer ECL and the cathode CE may be commonly disposed over the pixels PX.

The encapsulation layer TFE may be disposed on the cathode CE. The encapsulation layer TFE may cover the pixels. In the illustrated embodiment, the encapsulation layer TFE may directly cover the cathode CE. In an embodiment, the display panel DP (refer to FIG. 3A) may further include a capping layer that directly covers the cathode CE.

The encapsulation layer TFE may be disposed on the element layer DP_ED. The encapsulation layer TFE may include at least an inorganic layer or an organic layer. In an embodiment, the encapsulation layer TFE may include two inorganic layers and an organic layer disposed between the two inorganic layers. In an embodiment, the thin film encapsulation layer may include a plurality of inorganic layers and a plurality of organic layers alternately stacked with the inorganic layers.

The inorganic layers of the thin film encapsulation layer may protect the light-emitting element ED from moisture and oxygen, and the organic layer of the thin film encapsulation layer may protect the light-emitting element ED from a foreign substance such as dust particles. The inorganic layers of the thin film encapsulation layer may include a silicon nitride layer, a silicon oxynitride layer, a silicon oxide layer, a titanium oxide layer, or an aluminum oxide layer, however, it should not be particularly limited. The organic layer of the thin film encapsulation layer may include an acrylic-based organic layer, however, it should not be particularly limited.

Figure 4A:
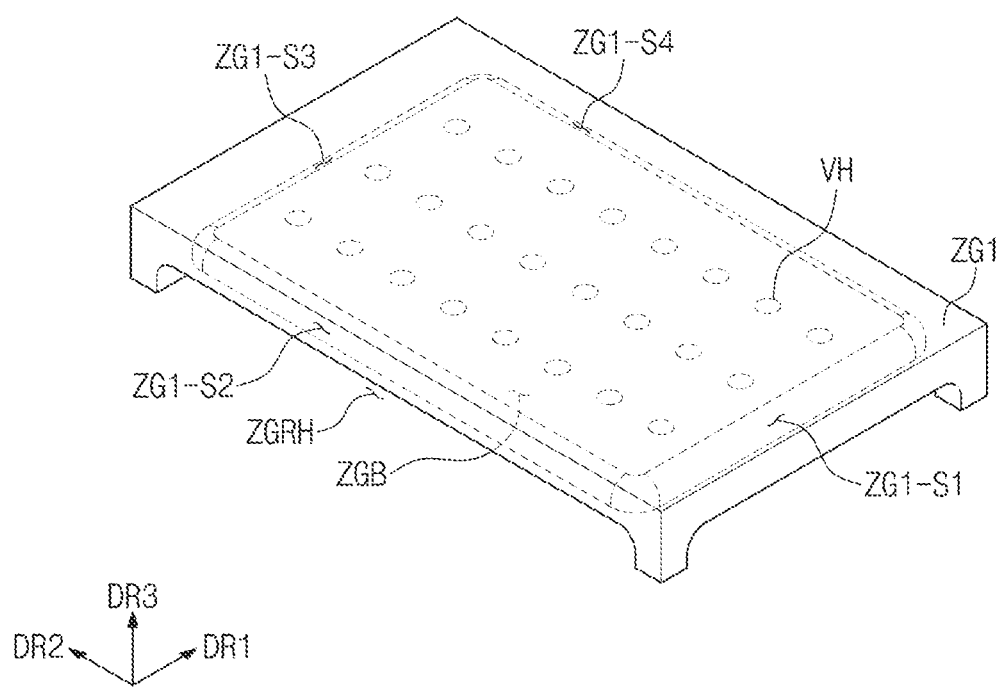
FIG. 4A is a perspective view of an embodiment of a portion of a lamination apparatus according to the invention.
Figure 4C:
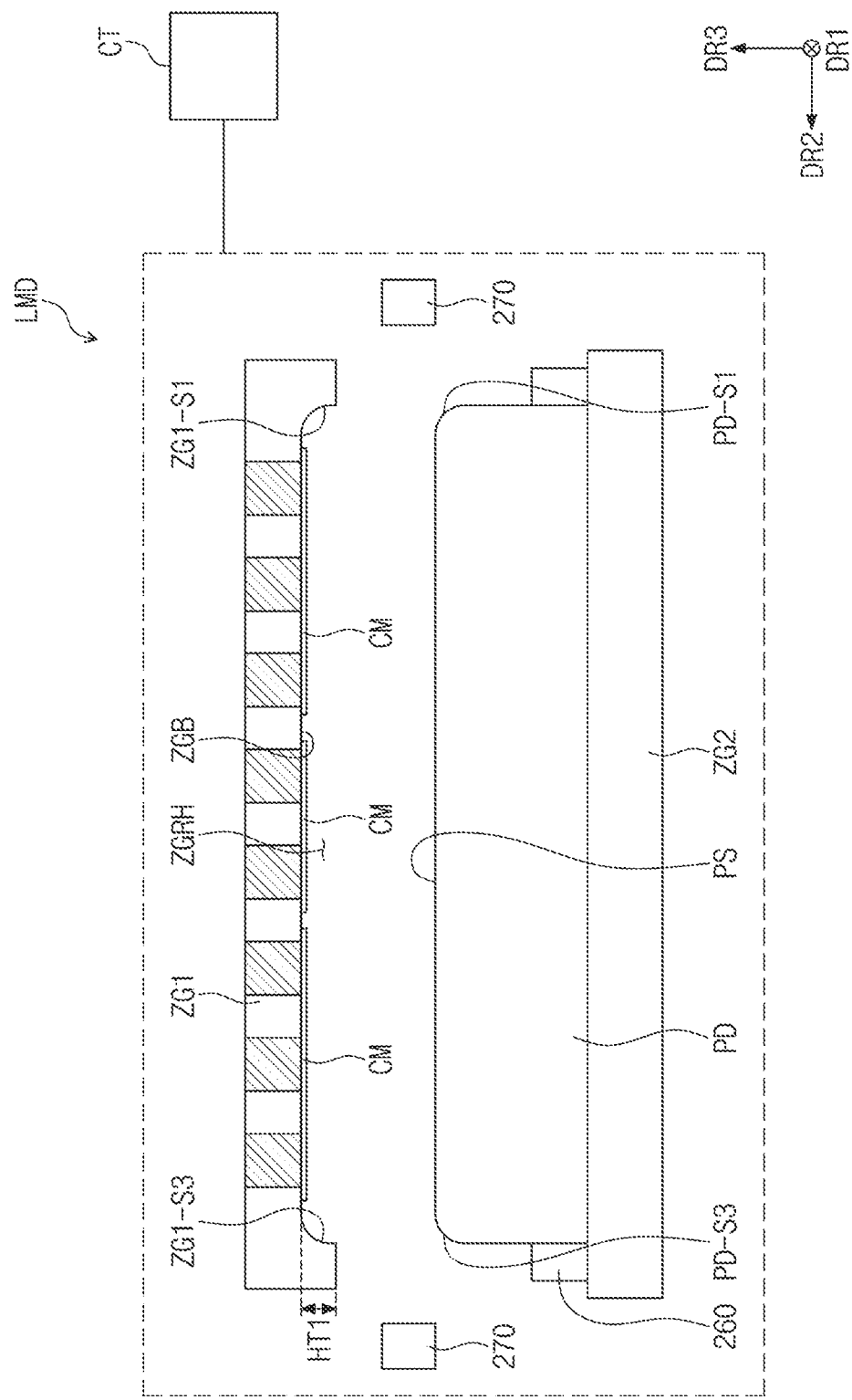

FIG. 4A is a perspective view of an embodiment of a portion of a lamination apparatus LMD according to the invention. FIGS. 4B and 4C are cross-sectional views of an embodiment of the lamination apparatus LMD according to the invention. FIG. 4A is a perspective view of a first jig ZG1, FIG. 4B is a view showing a cross-section of the lamination apparatus LMD, which is parallel to a plane defined by the first direction DR1 and the third direction DR3, and FIG. 4C is a view showing a cross-section of the lamination apparatus LMD, which is parallel to a plane defined by the second direction DR2 and the third direction DR3.

Referring to FIGS. 4A to 4C, the lamination apparatus LMD may include the first jig ZG1 (or an upper jig), a pad PD (or a pressure pad), a second jig ZG2, a clamp 240, a first pressure part 250, a shape controller 260, a second pressure part 270, and a controller CT.

The first jig ZG1 may include a bottom surface ZGB and first, second, third, and fourth side surfaces ZG1-S1, ZG1-S2, ZG1-S3, and ZG1-S4 bent and extending from the bottom surface ZGB. An accommodating recess ZGRH may be defined in the first jig ZG1 by the bottom surface ZGB and the first, second, third, and fourth side surfaces ZG1-S1, ZG1-S2, ZG1-S3, and ZG1-S4.

The first jig ZG1 may move toward the second jig ZG2 or may move away from the second jig ZG2. In an embodiment, the first jig ZG1 may move along a direction substantially parallel to the third direction DR3.

The first, second, third, and fourth side surfaces ZG1-S1, ZG1-S2, ZG1-S3, and ZG1-S4 of the first jig ZG1 may have different heights. In an embodiment, the first side surface ZG1-S1 and the third side surface ZG1-S3 may have the same height, e.g., a first height HT1, and the second side surface ZG1-S2 and the fourth side surface ZG1-S4 may have the same height, e.g., a second height HT2. The first height HT1 may be smaller than the second height HT2. The first height HT1 may indicate a height of a sidewall of the jig including the first side surface ZG1-S1, and the second height HT2 may indicate a height of a sidewall of the jig including the second side surface ZG1-S2.

The first height HT1 may correspond to a depth of a portion of the bottom surface ZGB adjacent to the first side surface ZG1-S1, and the second height HT2 may correspond to a depth of another portion of the bottom surface ZGB adjacent to the second side surface ZG1-S2.

A plurality of vacuum holes VH may be defined in the bottom surface ZGB of the first jig ZG1. The vacuum holes VH may include a first vacuum hole VH1 and a second vacuum hole VH2. The window WIN (refer to FIG. 2) may be fixed to the accommodating recess ZGRH by the vacuum holes VH.

A cover member CM may not overlap at least one vacuum hole, e.g., the vacuum hole VH2, of the vacuum holes VH. The first vacuum hole VH1 may be defined as vacuum holes VH1 overlapping the cover member CM among the vacuum holes VH, and the second vacuum hole VH2 may be defined as vacuum holes VH2 that do not overlap the cover member CM among the vacuum holes VH. FIG. 4B shows three vacuum holes VH1 and VH2 when viewed in the first direction DR1 and the third direction DR3 and one second vacuum hole VH2 that is not covered, however, the number of the vacuum holes VH1 and VH2 and the number of the second vacuum holes VH2 should not be particularly limited.

The pad PD may be disposed under the first jig ZG1. The pad PD may include an elastic material. In an embodiment, the pad PD may include a material that is easily deformed by a pressure and should not be particularly limited. In an embodiment, the pad PD may include silicone.

The pad PD may include a pressure surface PS and first, second, third, and fourth pad side surfaces PD-S1, PD-S2, PD-S3, and PD-S4 bent and extending from the pressure surface PS. The pressure surface PS may be a convex upper surface of the pad PD, and may be in contact with the second vacuum hole VH2 that does not overlap the cover member CM.

A side surface recess PDSH may be defined in portions of the pad PD, which are respectively adjacent to the second pad side surface PD-S2 and the fourth pad side surface PD-S4. The side surface recess PDSH may be provided to hold a carrier film 300 (refer to FIG. 13A) to which the display module DM (refer to FIG. 2) is attached. In an alternative embodiment, the side surface recess PDSH may be omitted. In an embodiment, the side surface recess PDSH may be additionally defined in at least one of a portion adjacent to the first pad side surface PD-S1 and a portion adjacent to the third pad side surface PD-S3.

The second jig ZG2 may be disposed under the pad PD. The second jig ZG2 may move the pad PD toward the first jig ZG1 or may move the pad PD away from the first jig ZG1. In an embodiment, the second jig ZG2 may move along the direction parallel to the third direction DR3 until the pad PD contacts the second vacuum hole VH2. A first section ST1 may be defined as a distance between the bottom surface ZGB of the first jig ZG1 and the pad PD.

The clamp 240 may be provided in plural, and the clamps 240 may be arranged in the first direction DR1 and may be spaced apart from each other. The clamps 240 may clamp the carrier film 300 (refer to FIG. 13A) to which the display panel DP (refer to FIG. 2) is attached. The clamps 240 may be replaced with other components. In an embodiment, the clamps 240 may be replaced with an insertion part in which a predetermined recess is defined. The clamps 240 may move toward each other or away from each other. In an embodiment, the clamps 240 may move in a direction substantially parallel to the first direction DR1.

The first pressure part 250 may have a bar shape extending in the second direction DR2. The first pressure part 250 may serve to hold the carrier film 300 (refer to FIG. 13A) that contacts the pad PD to be in close contact with the pad PD. In an embodiment, the first pressure part 250 may have a shape corresponding to the side surface recess PDSH.

The shape controller 260 may be disposed on the second jig ZG2 and may be disposed adjacent to the pad PD. In an embodiment, the shape controller 260 may be provided in plural, and the shape controllers 260 may be spaced apart from each other with the pad PD interposed therebetween. In an embodiment, the shape controllers 260 may be spaced apart from each other in the second direction DR2. The shape controllers 260 may be disposed adjacent to the first pad side surface PD-S1 and the third pad side surface PD-S3. Each of the shape controllers 260 may extend in the first direction DR1.

The shape controllers 260 may be disposed to face the side surfaces having a relatively low height among the first, second, third, and fourth side surfaces ZG1-S1, ZG1-S2, ZG1-S3, and ZG1-S4 of the first jig ZG1. In an embodiment, the shape controllers 260 may be disposed in an area facing the first side surface ZG1-S1 and an area facing the third side surface ZG1-S3.

The shape controllers 260 may control a shape of the pad PD when the pad PD presses the first jig ZG1. The shape controllers 260 may have more rigid properties than that that of the pad PD. In an embodiment, the shape controllers 260 may include a plastic material.

When the pad PD presses the first jig ZG1, the second side surface ZG1-S2, the fourth side surface ZG1-S4, and the shape controllers 260 may prevent the pad PD from protruding outward before the pad PD sufficiently presses the accommodating recess ZGRH of the first jig ZG1. Accordingly, when two targets are laminated using the pad PD, a probability of generating bubbles between the two targets may be reduced, and a yield of the lamination process may be improved.

Figure 13A:
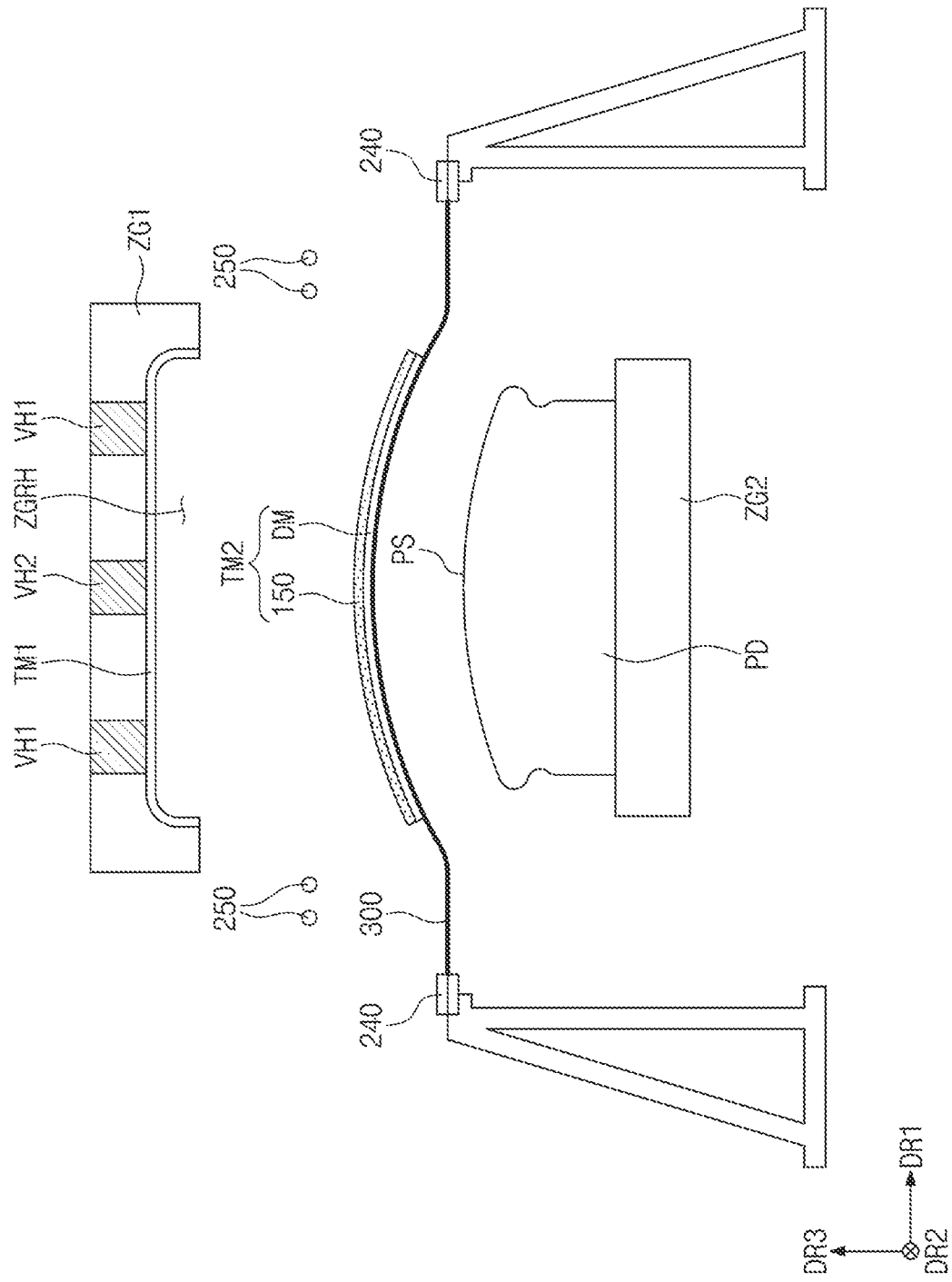
FIGS. 13A to 13E are views of an embodiment of some processes of a manufacturing method of a display device according to the invention.

The second pressure part 270 may be provided to change the shape of the carrier film 300 (refer to FIG. 13A). The second pressure part 270 may move along a direction substantially parallel to the second direction DR2. In an alternative embodiment, the second pressure part 270 may be omitted.

The controller CT may be a software that determines zero data Z-DT, a processor executing the software, or a computer including the processor. The controller CT may control the movement of the first jig ZG1 and the second jig ZG2, may control the operation of the vacuum holes VH, and may control the measurement of vacuum values VD (refer to FIG. 4D) from the vacuum holes VH.

The controller CT may set the zero data Z-DT (refer to FIG. 4D) based on the vacuum value measured from the second vacuum hole VH2. The zero data Z-DT may be information about a position of the first jig ZG1 and a position of the second jig ZG2 when the pad PD contacts the first jig ZG1 to cover at least the second vacuum hole VH2. In an embodiment, the zero data Z-DT may be information about a position of the first jig ZG1 and a position of the second jig ZG2, or information about the position of the second jig ZG2 at a time when the first target member TM1 (refer to FIG. 13C) and the second target member TM2 (refer to FIG. 13C) contact with each other and the press is generated. The process of setting the zero data Z-DT will be described later. The lamination apparatus shown in FIGS. 4B and 4C is merely one of embodiments, and the invention should not be limited thereto or thereby. In an embodiment, the above-described configurations may be applied to all lamination apparatuses that generate the zero data using the variation of the vacuum value.

Figure 4D:
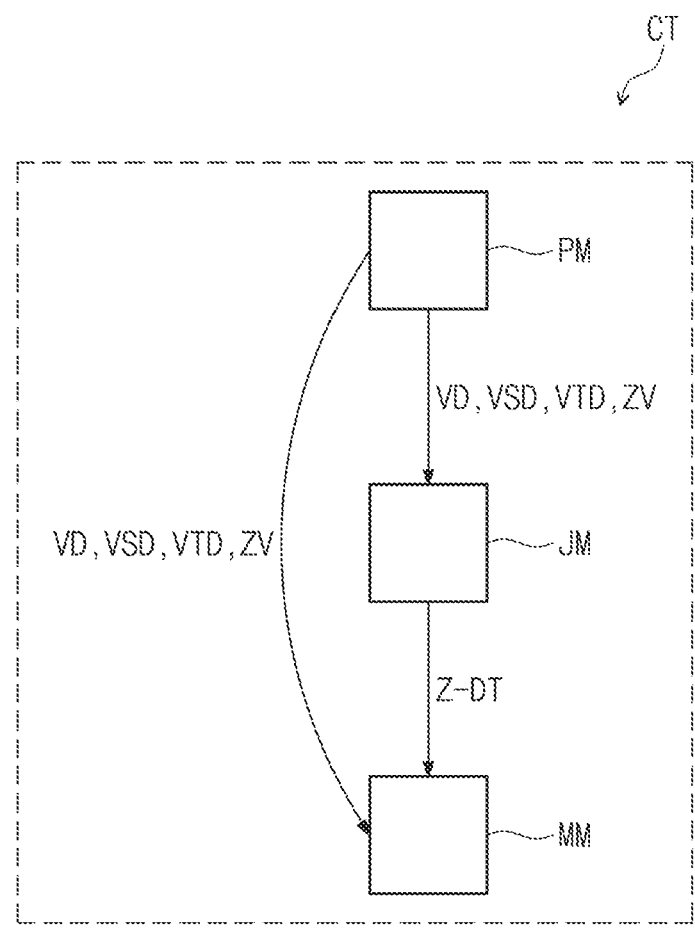
FIG. 4D is a block diagram of an embodiment of a controller according to the invention.

FIG. 4D is a block diagram of an embodiment of the controller CT according to the invention.

Referring to FIGS. 4B and 4D, the controller CT may include a processor PM, a determinator JM, and a memory MM.

The processor PM may measure the vacuum values VD from at least the vacuum holes VH2 and may generate a plurality of data VSD, VTD, and ZV based on the vacuum values VD. The determinator JM may set the zero data Z-DT based on the data VD, VSD, VTD, and ZV. The memory MM may store the data VD, VSD, VTD, and ZV generated by the processor PM and the zero data Z-DT reset by the determinator JM.

The vacuum value VD may be measured multiple times depending on a relative position between the first jig ZG1 and the pad PD. In an embodiment, when the first jig ZG1 and the second jig ZG2 are included in the first section ST1, the vacuum value VD may be measured multiple times depending on a variation in distance between the first jig ZG1 and the second jig ZG2.

The second jig ZG2 may move to allow the pad PD to approach the bottom surface ZGB in which the second vacuum hole VH2 is defined, and the processor PM may measure the vacuum value VD multiple times when the pad PD approaches the bottom surface ZGB.

When the same vacuum value VD is continuously measured, the same vacuum value VD may be defined as vacuum saturation data VSD.

Vacuum reference data VTD may be defined as data obtained by correcting the vacuum saturation data VSD with a predetermined value. The predetermined value may be an experimental value that allows a Z-axis value ZV, which is obtained from different vacuum saturation data VSD after measuring the vacuum saturation data VSD multiple times, to have a value within a predetermined range. In an embodiment, the predetermined value may be about −1 kilopascal (KPa).

The Z-axis value ZV may be a height value of the pressure surface (hereinafter, also referred to as an upper surface) PS of the pad PD when the second jig ZG2 is raised slowly and the vacuum value VD is changed to another value in a state that the vacuum value VD has a value corresponding to the vacuum reference data VTD. In an embodiment, the Z-axis value ZV may be a coordinate value of a Z-axis direction of the second jig ZG2 when the vacuum value VD corresponding to the vacuum reference data VTD is changed to another value.

The zero data Z-DT may be the Z-axis value ZV or a value obtained by correcting the Z-axis value ZV. The process of setting the zero data Z-DT may be performed without the window WIN on the bottom surface ZGB of the first jig ZG1. Accordingly, differently from a case where a coupling process is performed using the lamination apparatus LMD, a difference in height corresponding to a thickness of the window WIN may be generated. The correction value may correspond to a thickness value of the window WIN. That is, the zero data Z-DT may correspond to a value obtained by subtracting the thickness value of the window WIN from the Z-axis value ZV.

Figure 5:
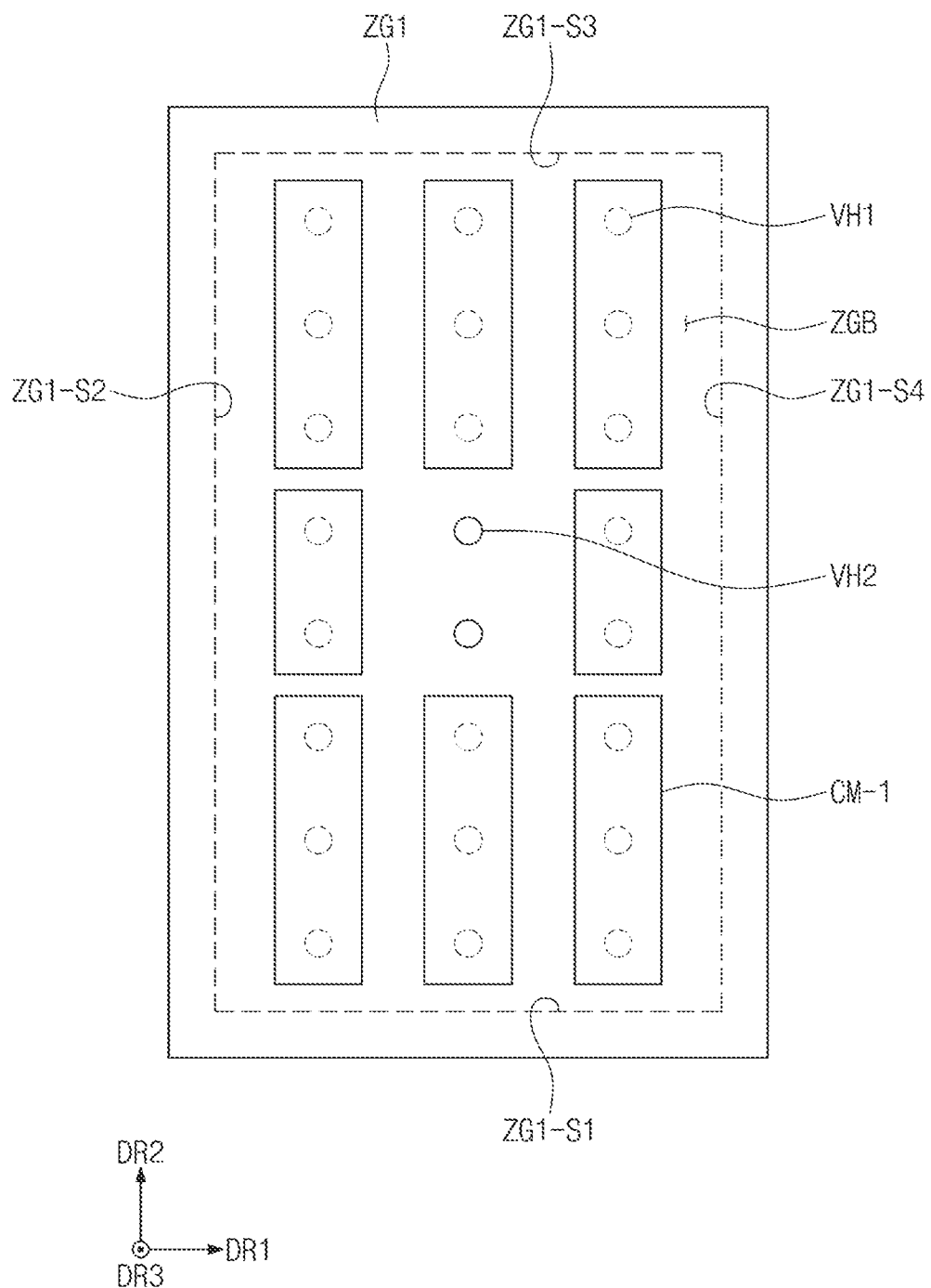
FIG. 5 is a plan view of an embodiment of a first jig according to the invention.

FIG. 5 is a plan view of an embodiment of the first jig ZG1 according to the invention.

In FIG. 5, the bottom surface ZGB and the first, second, third, and fourth side surfaces ZG1-S1, ZG1-S2, ZG1-S3, and ZG1-S4, which define the accommodating recess ZGRH (refer to FIG. 4B) of the first jig ZG1, are shown.

The first side surface ZG1-S1 and the third side surface ZG1-S3 may extend in the first direction DR1 and may be spaced apart from each other in the second direction DR2. The second side surface ZG1-S2 and the fourth side surface ZG1-S4 may extend in the second direction DR2 and may be spaced apart from each other in the first direction DR1. In a plan view as viewed in a thickness direction, e.g., the third direction DR3, of the first jig ZG1, the bottom surface ZGB may have a quadrangular shape, however, the shape of the bottom surface ZGB should not be limited to the quadrangular shape. The shape of the bottom surface ZGB may be changed depending on a target to be laminated. In an embodiment, the bottom surface ZGB may have a circular, polygonal, oval, or irregular shape.

The vacuum holes VH1 and VH2 may be defined through the bottom surface ZGB.

A first cover member CM-1 may cover at least the vacuum holes VH1 among the vacuum holes VH1 and VH2. The vacuum holes VH1 and VH2 may include the first vacuum holes VH1 that overlap the first cover member CM-1 and the second vacuum holes VH2 that do not overlap the first cover member CM-1.

In an embodiment, the first cover member CM-1 may include a tape, but is not limited thereto. The first cover member CM-1 may be attached to the first vacuum holes VH1 except the second vacuum holes VH2 to precisely measure the vacuum value VD (refer to FIG. 4D) that is changed as the pad PD (refer to FIG. 4B) ascends. The first cover member CM-1 may be provided in plural, and the first cover members CM-1 may be attached to the first vacuum holes VH1.

In a case where the first cover member CM-1 includes the tape, the first cover member CM-1 may be easily attached and detached. Accordingly, a position of the first vacuum holes VH1 that are not covered by the first cover member CM-1 may be easily changed as necessary.

The upper surface PS (refer to FIG. 4B) of the pad PD (refer to FIG. 4B) may have a protruded shape, and the second vacuum holes VH2 may be in contact with a protruded portion of the pad PD. In an embodiment, the second vacuum holes VH2 may be defined along the second direction DR2 and may be spaced apart from each other. In an embodiment, the first cover member CM-1 may be attached to the first zig ZG1 to cover the first vacuum holes VH1, and thus, the vacuum values VD may be measured from two or more vacuum holes VH2.

FIG. 5 shows twenty two first vacuum holes VH1 and two second vacuum holes VH2 as an illustrated embodiment, however, the number of the first vacuum holes VH1 and the number of the second vacuum holes VH2 should not be particularly limited. In an embodiment, the number of the first and second vacuum holes VH1 and VH2 may be changed depending on a size and a shape of the pad PD (refer to FIG. 4B). However, when the pad PD includes the protruded upper surface PS (refer to FIG. 4B), the number of the vacuum holes VH2 that are in contact with the pad PD and are covered by the pad PD may increase as the number of the second vacuum holes VH2 increases. As a result, the precision of the zero data Z-DT (refer to FIG. 4D) obtained based on the vacuum value VD (refer to FIG. 4D) may be reduced. Therefore, the zero data Z-DT may be set after the vacuum holes are blocked using the first cover member CM-1 except the vacuum holes corresponding to the most protruding part of the upper surface PS of the pad PD or the vacuum holes corresponding to a portion of the pad PD adjacent to the most protruding part of the upper surface PS.

Figure 6:
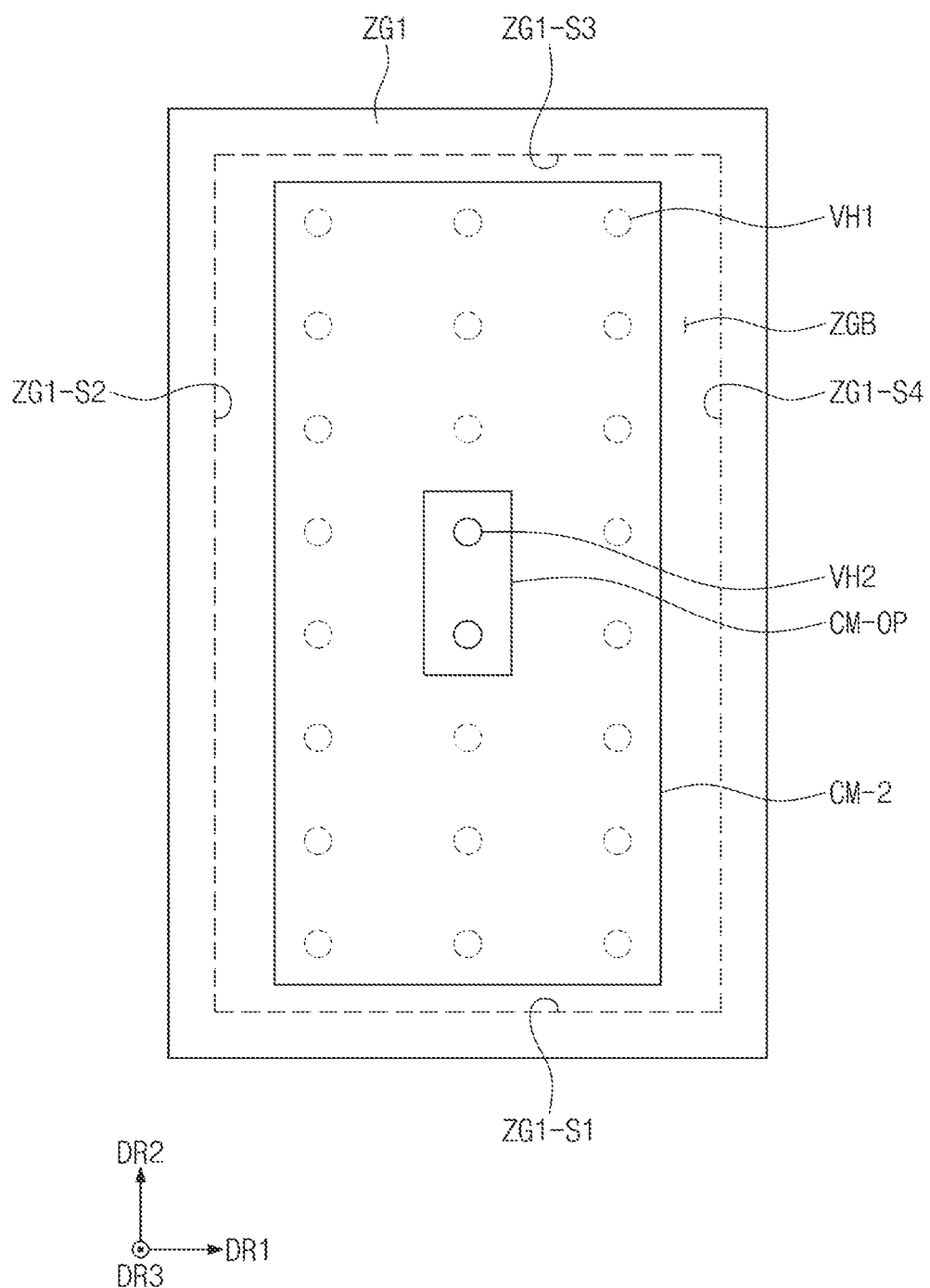
FIG. 6 is a plan view of an embodiment of a first jig according to the invention.

FIG. 6 is a plan view of an embodiment of a first jig ZG1 according to the invention. In FIG. 6, the same reference numerals denote the same elements in FIG. 5, and thus, detailed descriptions of the same elements will be omitted.

Referring to FIG. 6, a second cover member CM-2 may include a setting window through which an opening CM-OP is defined. The second cover member CM-2 may be attached to a bottom surface ZGB of the first jig ZG1. A first vacuum hole VH1 may be covered by the second cover member CM-2, and a second vacuum hole VH2 may overlap the opening CM-OP and may not be covered by the second cover member CM-2.

The second cover member CM-2 may be a component with a fixed shape.

Accordingly, the second cover member CM-2 may uniformly cover plural first vacuum holes VH1 that are unnecessary to set zero data. In addition, since the second cover member CM-2 with the fixed shape may be provided to the bottom surface ZGB whenever the setting of the zero data Z-DT (refer to FIG. 4D) is desired, the speed of setting the zero data Z-DT when the second cover member CM-2 is provided may be faster than a speed of setting the zero data Z-DT when the first cover member CM-1 (refer to FIG. 5) is provided.

Figure 7:
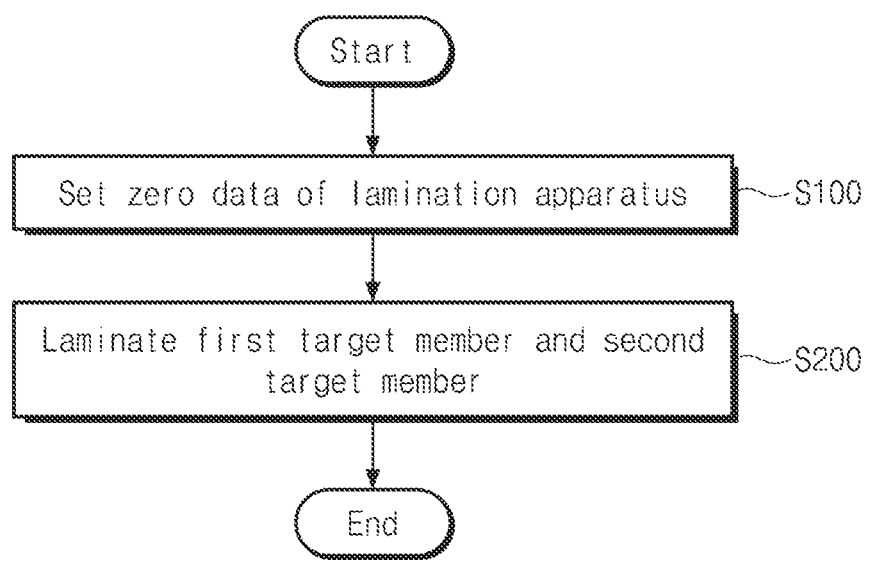
FIG. 7 is a flowchart of an embodiment of a method of manufacturing a display device according to the invention.

FIG. 7 is a flowchart of an embodiment of a method of manufacturing a display device according to the invention.

Referring to FIGS. 4B, 4D, and 7, the zero data Z-DT of the lamination apparatus LMD may be set (S100). The zero data Z-DT may be also referred to as a zero point or a zero value. The controller CT of the lamination apparatus LMD may set the zero data Z-DT based on the vacuum value VD measured from some vacuum holes VH2 according to first and second target members TM1 and TM2 (refer to FIG. 13A).

After the zero data Z-DT are set, the cover member CM may be removed from the lamination apparatus LMD. Then, the first target member TM1 (refer to FIG. 13A) may be disposed on the first jig ZG1, and the second target member TM2 (refer to FIG. 13A) may be disposed on the second jig ZG2. The first target member TM1 may be laminated with the second target member TM2 (S200). Each of the first target member TM1 and the second target member TM2 may be a part of the display device DD (refer to FIG. 1). In an embodiment, the first target member TM1 may be the window WIN (refer to FIG. 2), the second target member TM2 may be the display module DM (refer to FIG. 2), and the adhesive layer 150 (refer to FIG. 2) may be an adhesive material disposed between the first target member TM1 and the second target member TM2 to attach the first and second target members TM1 and TM2 to each other.

Figure 8:
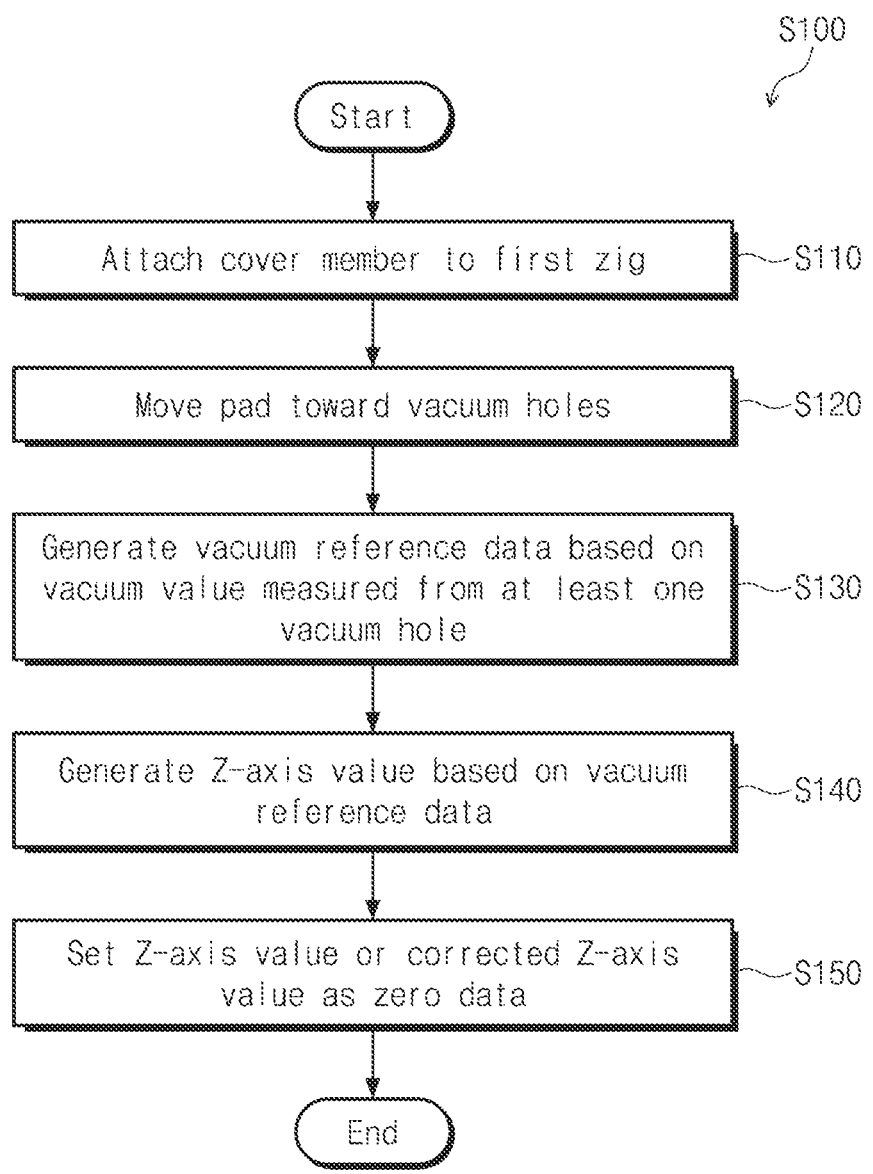
FIG. 8 is a flowchart of an embodiment of a method of setting zero data according to the invention.

FIG. 8 is a flowchart showing an embodiment of the setting of the zero data (S100) according to the invention.

Referring to FIGS. 4B, 4D, and 8, the cover member CM may be attached to the bottom surface ZGB of the first jig ZG1 (S110). The cover member CM may be the first cover member CM-1 including a tape (refer to FIG. 5) or the second cover member CM-2 including a setting window (refer to FIG. 6).

Referring to FIG. 5, the cover member CM may be the tape CM-1. The first cover member CM-1 may be attached to the vacuum holes VH1 except at least some vacuum holes VH2 among the vacuum holes VH1 and VH2 defined through the bottom surface ZGB of the first jig ZG1.

Referring to FIG. 6, the cover member CM may be the second cover member CM-2 including a setting window through which the opening CM-OP is defined. The second cover member CM-2 may be attached to the bottom surface ZGB of the first jig ZG1 after aligning the second cover member CM-2 such that the opening CM-OP of the setting window CM-2 overlaps the vacuum holes VH2.

The pad PD may move to the vacuum holes VH1 and VH2 (S120). The pad PD may be disposed on the second jig ZG2. The second jig ZG2 may move along the direction parallel to the third direction DR3 such that the pad PD is disposed adjacent to or contacts the vacuum holes VH1 and VH2.

The controller CT of the lamination apparatus LMD may generate the zero data Z-DT based on the vacuum value VD measured from the second vacuum hole VH2. The setting of the zero data Z-DT may include generating the vacuum reference data VTD based on the vacuum value VD measured from the second vacuum hole VH2 (S130), generating the Z-axis value ZV based on the vacuum reference data VTD (S140), and setting the Z-axis value ZV or the corrected Z-axis value ZV to the zero data Z-DT (S150). Details thereof will be described later.

The vacuum value VD may be constant when the pad PD and the bottom surface ZGB of the first jig ZG1 are close to each other and may be changed when the pad PD and the bottom surface ZGB are in contact with each other. Accordingly, the generating of the vacuum reference data (S130) may be an operation to specify the position of the pad PD in the state where the pad PD is close to the bottom surface ZGB. When the second jig ZG2 continuously moves without the generating of the vacuum reference data (S130), the vacuum value VD continues to increase. As a result, it may be impossible to determine how close the pad PD is to the bottom surface ZGB, and it may be difficult to set the zero data Z-DT.

Figure 9:
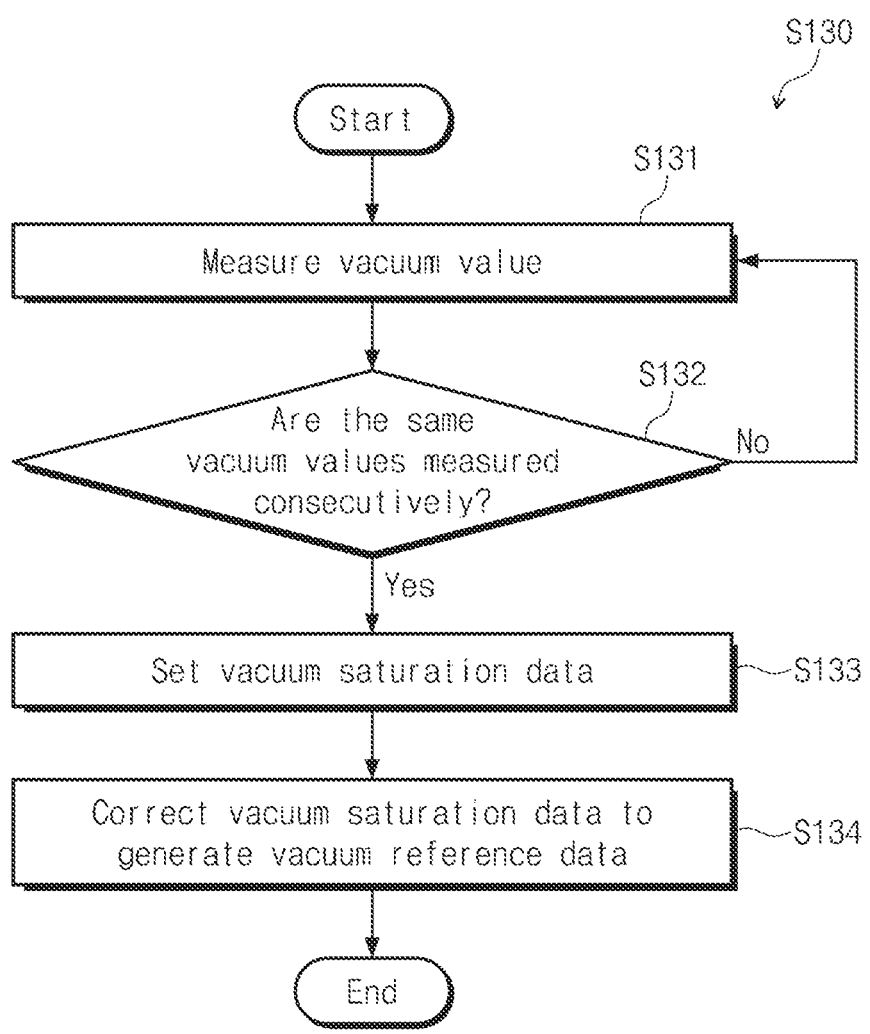
FIG. 9 is a flowchart of an embodiment of a method of generating vacuum reference data according to the invention.
Figure 10:
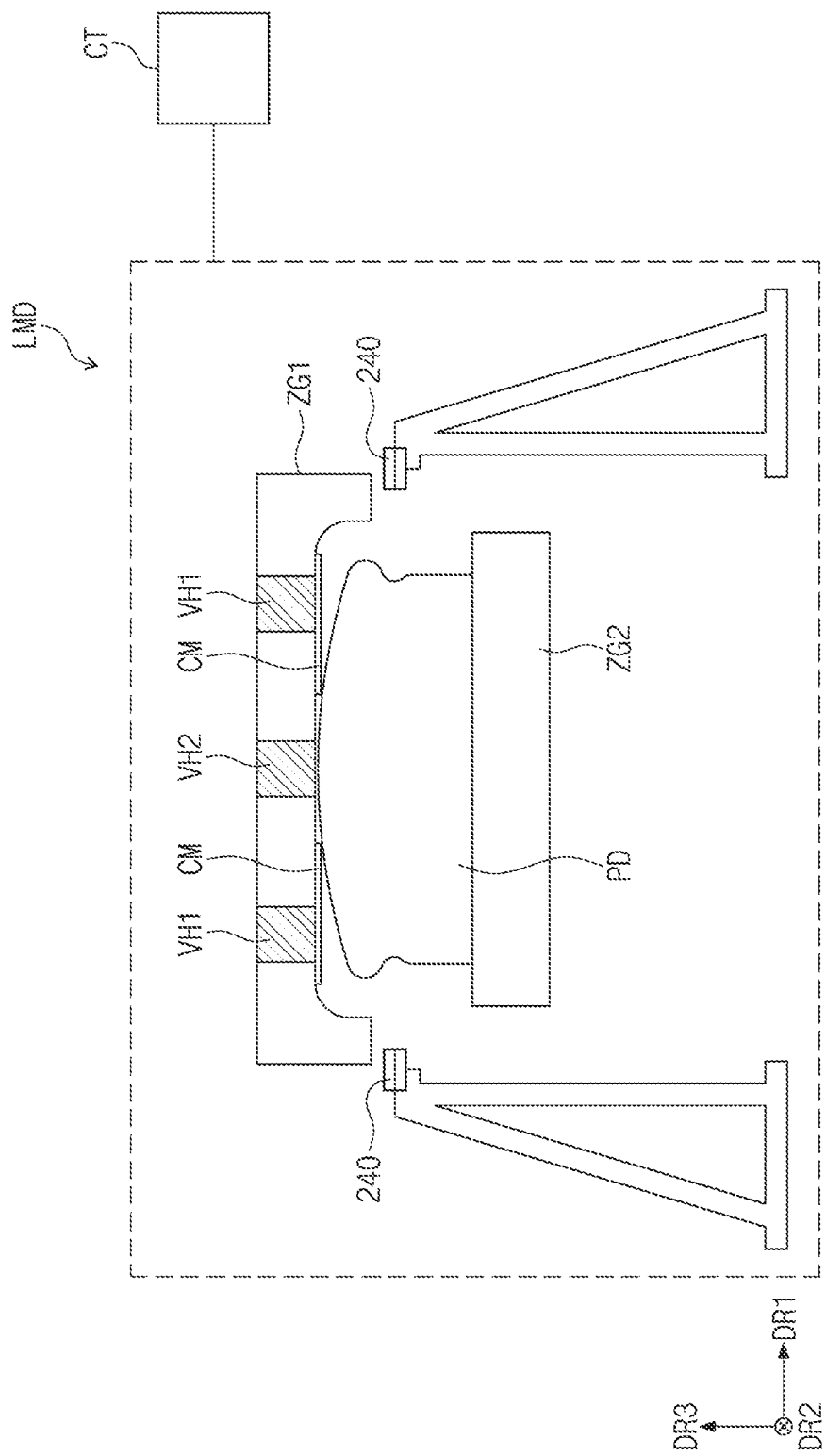
FIG. 10 is a view of an embodiment of a lamination apparatus generating the vacuum reference data according to the invention.

FIG. 9 is a flowchart showing an embodiment of the generating of the vacuum reference data (S130) according to the invention. FIG. 10 is a view of the lamination apparatus LMD that generates the vacuum reference data VTD.

Referring to FIGS. 4D, 9, and 10, when the distance ST1 (refer to FIG. 4B) between the first jig ZG1 and the pad PD is equal to or smaller than a predetermined distance, the vacuum value VD may be measured (S131). The first jig ZG1 may move along a direction opposite to the third direction DR3. When the movement of the first jig ZG1 is finished, the second jig ZG2 may move along the third direction DR3. The second jig ZG2 may move until the distance ST1 between the first jig ZG1 and the pad PD is equal to or smaller than the predetermined distance, and then, the vacuum value VD may be measured. The predetermined distance may be an approximate distance of the section in which the vacuum value VD corresponding to the vacuum saturation data VSD may be measured. The predetermined distance may be obtained from the experimental value.

After the vacuum value VD is measured, the second jig ZG2 may move along the direction opposite to the third direction DR3, and the first jig ZG1 may move along the third direction DR3. That is, the lamination apparatus LMD may return to its initial state before operation. Then, the first jig ZG1 may move along the direction opposite to the third direction DR3 and when the movement of the first jig ZG1 is finished, the second jig ZG2 may move along the third direction DR3 to measure the vacuum value VD multiple times. The movement of the first jig ZG1 and the second jig ZG2 may be repeated whenever the vacuum value VD is measured.

The controller CT may determine whether the vacuum values VD measured multiple times have constantly the same value (S132). When the same value is consecutively measured, the measured same vacuum value may be set as the vacuum saturation data VSD (S133). When the vacuum values consecutively measured are not the same, the vacuum value VD may be measured again. When the vacuum values VD have constantly the same value, it may indicate that the pad PD is close to the bottom surface ZGB of the first jig ZG1, and the pad PD may not be in contact with the bottom surface ZGB of the first jig ZG1.

The processor PM may correct the vacuum saturation data VSD with the predetermined value and may generate the vacuum reference data VTD (S134). The predetermined value may be the experimental value that allows the Z-axis value ZV, which is derived from different vacuum saturation data VSD obtained by measuring the vacuum saturation data VSD multiple times, to have a value within a predetermined range. In an embodiment, the predetermined value may be −1 KPa.

Figure 11:
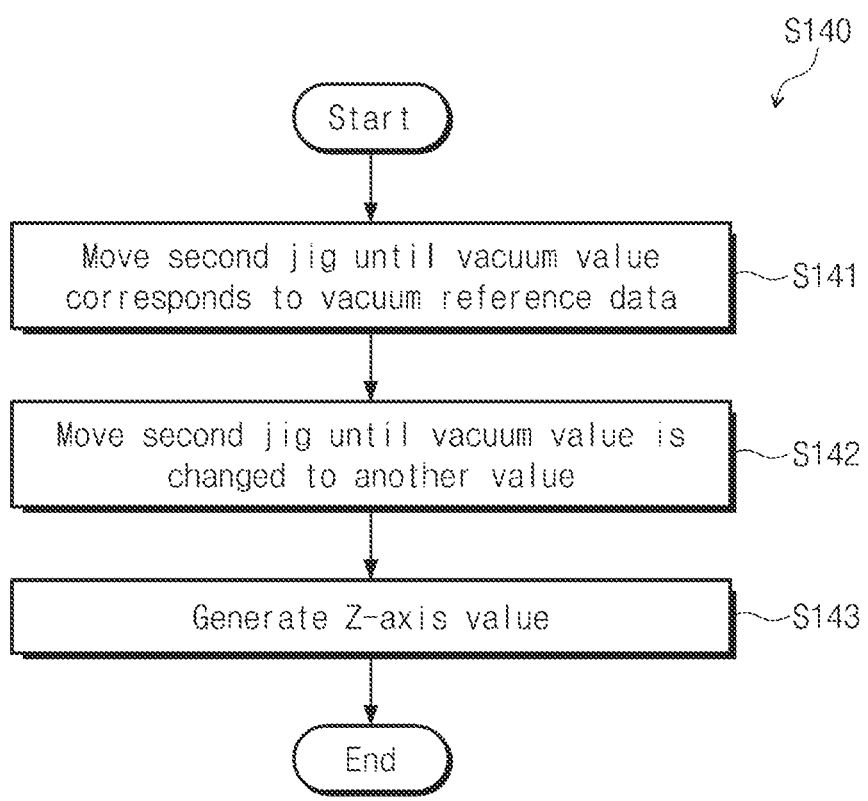
FIG. 11 is a flowchart of an embodiment of a method of generating a Z-axis value according to the invention.
Figure 12:
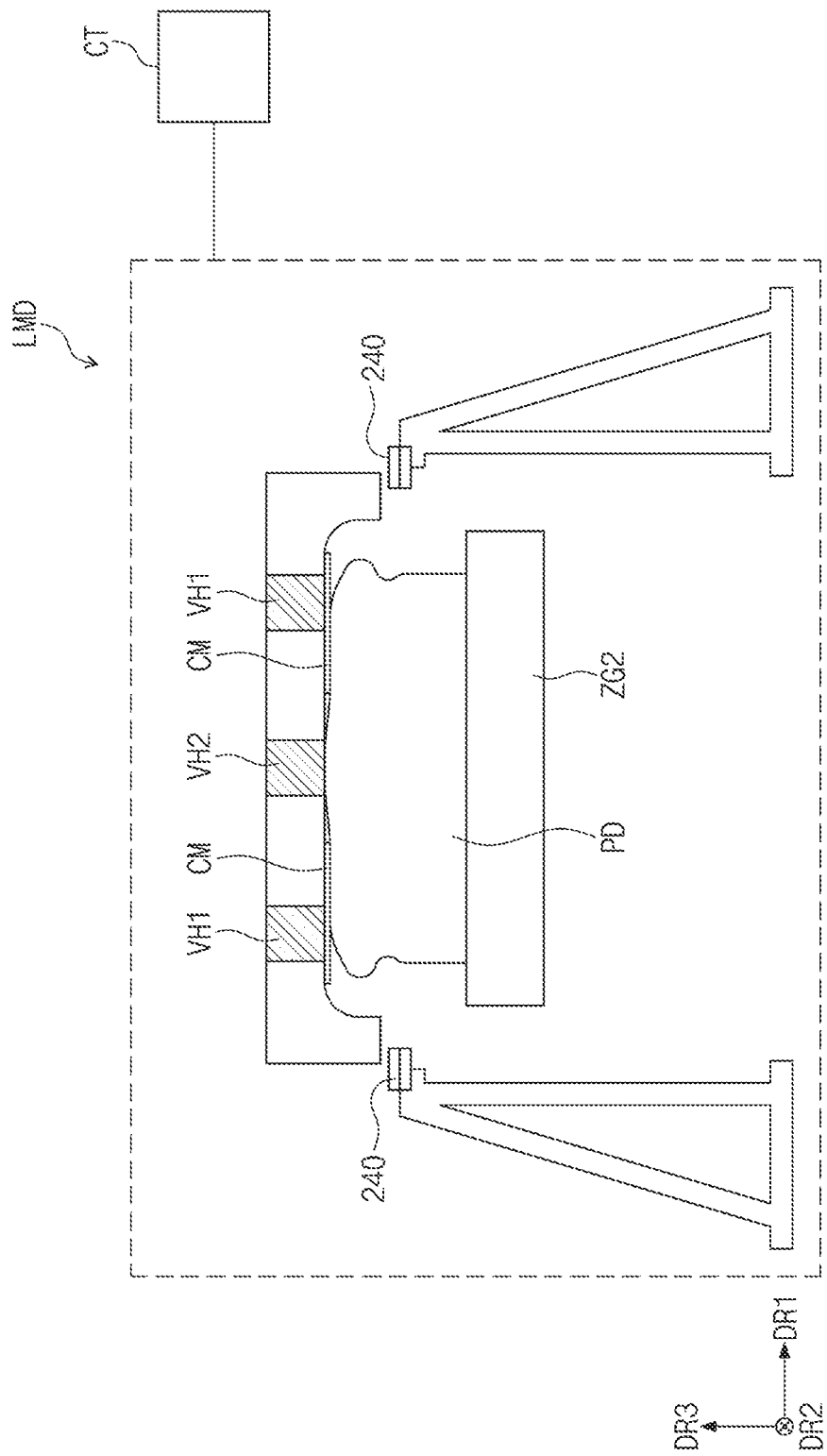
FIG. 12 is a view of an embodiment of a lamination apparatus generating the Z-axis value according to the invention.

FIG. 11 is a flowchart showing an embodiment of the generating of the Z-axis value (S140) according to the invention. FIG. 12 is a view of an embodiment of the lamination apparatus LMD generating the Z-axis value ZV according to the invention.

Referring to FIGS. 4D, 11, and 12, the second jig ZG2 may move along the third direction DR3 until the vacuum value VD becomes the value corresponding to the vacuum reference data VTD (S141). The moving of the second jig ZG2 (S141) may be referred to as a first moving operation S141. The first jig ZG1 may move along the direction opposite to the third direction DR3 by a predetermined distance, and then the second jig ZG2 may move along the third direction DR3 until the vacuum value VD corresponds to the vacuum reference data VTD.

The second jig ZG2 may move along the third direction DR3 after the first moving operation S141 until the vacuum value VD having the value corresponding to the vacuum reference data VTD is changed to another value (S142). The moving of the second jig ZG2 (S142) may be referred to as a second moving operation (S142).

The first moving operation S141 may be an operation to move the pad PD to be close to the bottom surface ZGB, and the second moving operation S142 may be an operation to move the pad PD until the pad PD contacts the second vacuum hole VH2 of the bottom surface ZGB. A moving speed of the second jig ZG2 in the first moving operation S141 may be different from a moving speed of the second jig ZG2 in the second moving operation S142. In an embodiment, the moving speed of the second jig ZG2 in the first moving operation S141 may be faster than the moving speed of the second jig ZG2 in the second moving operation S142.

The controller CT may generate the height value of the upper surface PS (or the height value of the pressure surface) of the pad PD when the vacuum value VD is changed from the value corresponding to the vacuum reference data VTD to another value as the Z-axis value (S143). The zero data Z-DT may be set based on the Z-axis value ZV.

FIGS. 13A to 13E are views of an embodiment of some processes of a manufacturing method of a display device according to the invention.

FIG. 13A shows an initial state of the lamination apparatus. In the invention, the initial state may mean a state that the clamps 240 clamp the carrier film 300 to which the second target member TM2 is attached and the first target member TM1 is spaced apart from the second target member TM2.

Referring to FIG. 13A, the first target member TM1 may be placed in the accommodating recess ZGRH of the first jig ZG1. The first target member TM1 may be the window WIN (refer to FIG. 2). A portion of the accommodating recess ZGRH may have a shape that correspond to a shape of the first target member TM1.

The display module DM and the adhesive layer 150, which are disposed on the pad PD, may be defined as the second target member TM2. The carrier film 300 may be attached to a rear surface of the display module DM, and the adhesive layer 150 may be attached to an upper surface of the display module DM. FIG. 13A shows the embodiment in which the adhesive layer 150 is applied to the upper surface of the display module DM, however, the invention should not be limited thereto or thereby. In an embodiment, the adhesive layer 150 may be disposed on a lower surface of the first target member TM1. The carrier film 300 and the adhesive layer 150 may be attached to the non-bending area NBA (refer to FIG. 2) of the display module DM.

The display module DM may be fixed to the clamp 240. In an embodiment, the clamps 240 may clamp the carrier film 300. That is, the display module DM may be indirectly fixed to the clamps 240 using the carrier film 300 without being directly fixed to the clamps 240. Accordingly, damages caused by the clamping operation of the clamps 240 may be prevented from occurring in the display module DM. As the clamps 240 approach each other, the display module DM may be bent into an arc shape. In an embodiment, the display module DM may be bent into a parabolic shape when viewed in cross-section.

The lamination process may be performed while the first jig ZG1 and the second jig ZG2 approach each other. That is, the first jig ZG1 and the second jig ZG2 may approach each other as the first jig ZG1 descends, as the second jig ZG2 ascends, or as the first jig ZG1 descends and the second jig ZG2 ascends. Hereinafter, for the convenience of explanation, a case where the first jig ZG1 does not move and the second jig ZG2 ascends will be described as an illustrated embodiment.

Figure 13B:
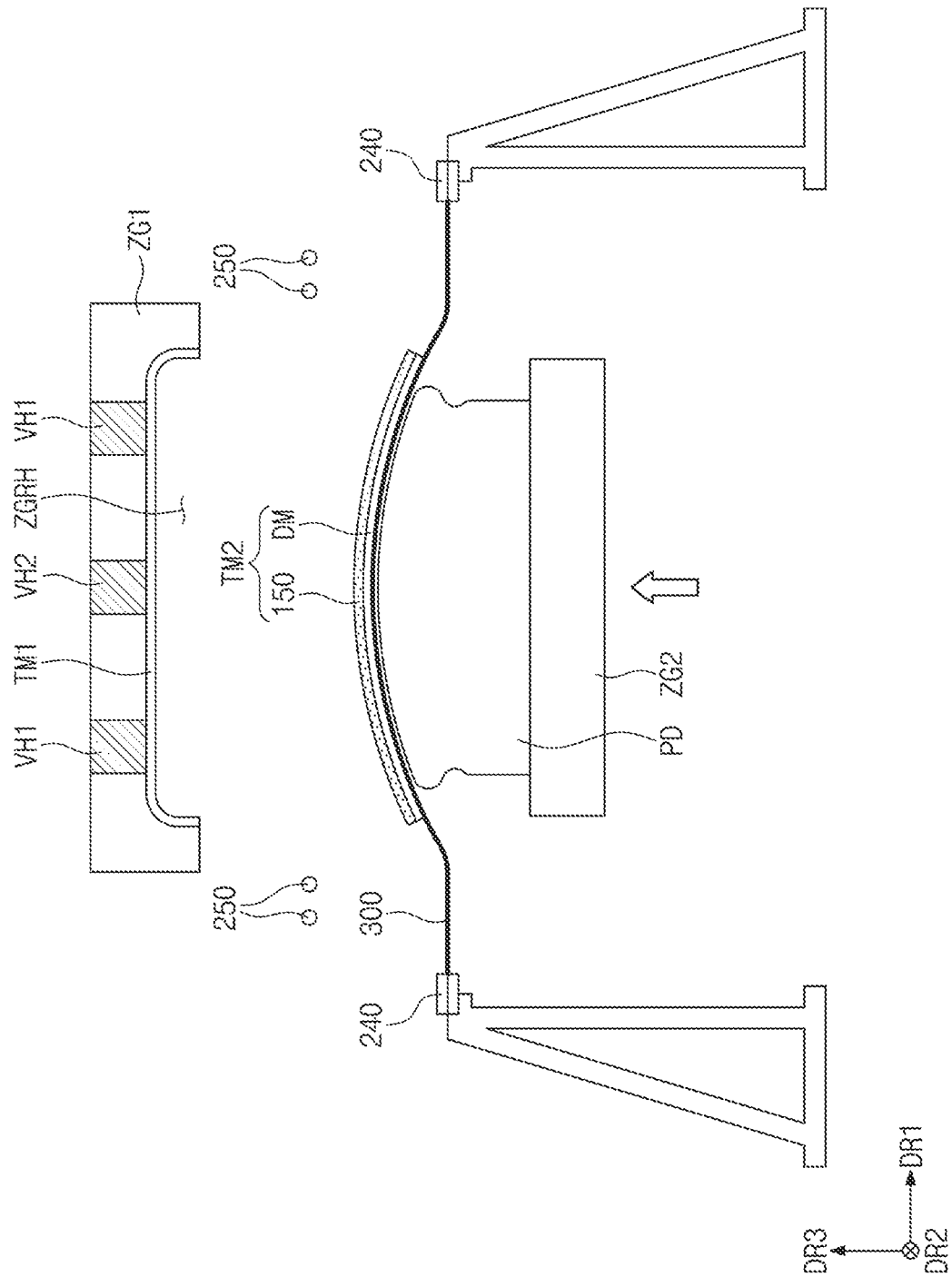

Referring to FIG. 13B, as the second jig ZG2 ascends, the lower surface of the display module DM may be in contact with the pad PD. The pad PD may have elasticity and may be changed in shape due to a pressure applied thereto when being in contact with the display module DM. That is, when the second jig ZG2 ascends, the lower surface of the display module DM may be in surface contact with the pad PD.

Figure 13C:
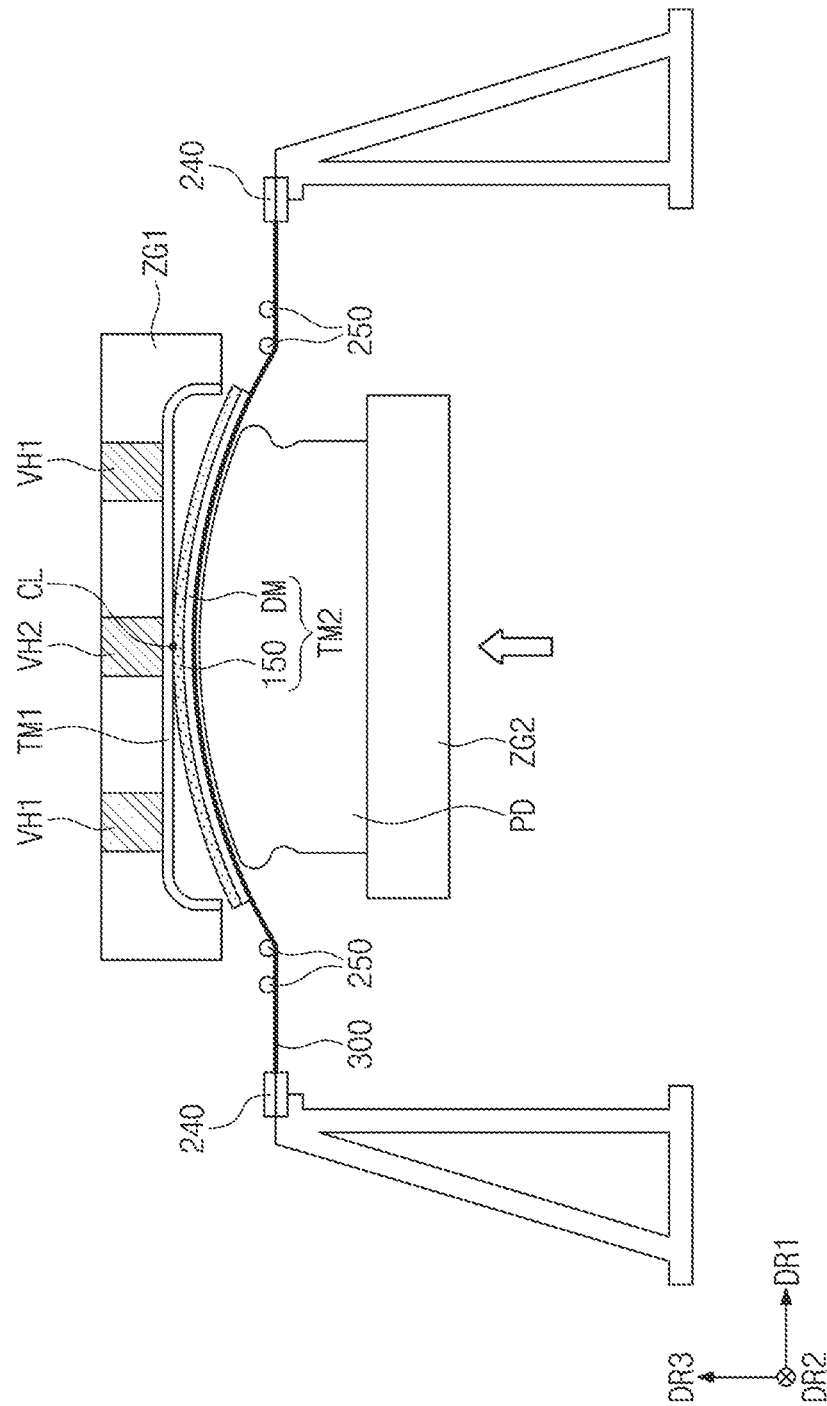

Referring to FIG. 13C, as the second jig ZG2 ascends, second target member TM2 disposed on the display module DM may be first in contact with a center portion of the first target member TM1. In this case, the plane of the first target member TM1 may be in line contact with the adhesive layer 150 of the second target member TM2 having a parabolic shape at the center portion. That is, an adhesive line CL may be formed or provided in the first target member TM1 and the adhesive layer 150.

The adhesive line CL may be a value corresponding to the zero data Z-DT set before the lamination process begins. The zero data Z-DT set before the beginning of the lamination process may be set using the vacuum hole VH2 that contacts the most protruding portion of the upper surface PS (refer to FIG. 13A) of the pad PD. Accordingly, when the second jig ZG2 moves to correspond to the zero data Z-DT, the adhesive line CL at which the most protruding portion of the second target member TM2 contacts the first target member TM1 may be formed or provided. A time point where the adhesive line CL is formed may correspond to a time point where the first and second target members TM1 are TM2 are pressed. That is, according to the invention, since the zero data Z-DT, which is the time point where the first and second target members TM1 and TM2 are pressed, are reset based on the vacuum value VD, defects related to a degree of the pressure to the first and second target members TM1 and TM2 may be removed.

Figure 13D:
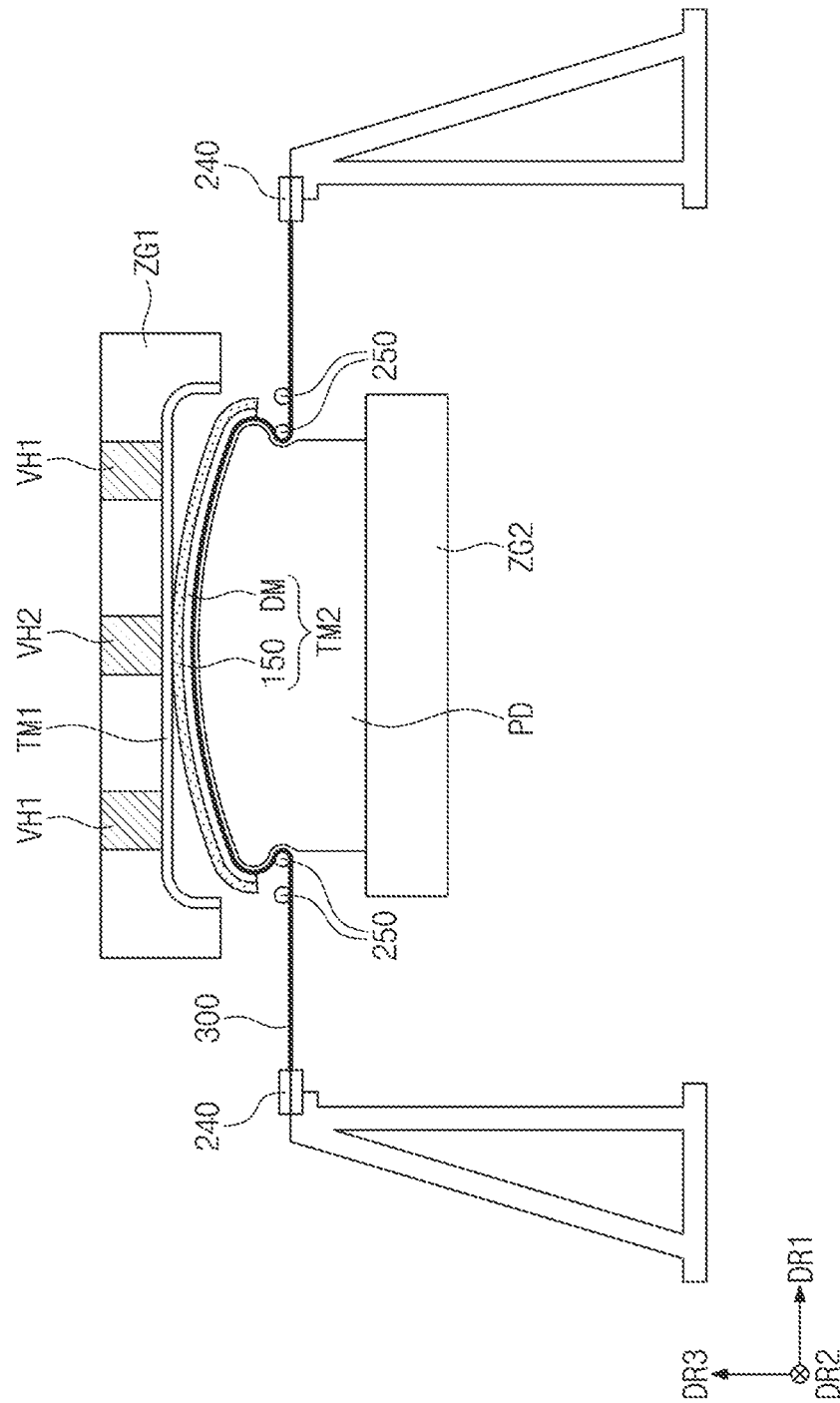

Referring to FIG. 13D, after the second target member TM2 contacts the first target member TM1, the clamps 240 may move in a direction in which the clamps 240 approach each other. Accordingly, the carrier film 300, the display module DM, and the adhesive layer 150 may be bent. The direction in which the clamps 240 approach each other may be substantially parallel to the first direction DR1, and the display module DM may be bent with respect to the third direction DR3. In an embodiment, the non-bending area NBA (refer to FIG. 2) of the display module DM may be bent with respect to the third direction DR3.

The first pressure part 250 may hold the carrier film 300 in contact with the pad PD to be in close contact with the pad PD. In addition, the first pressure part 250 may change the shape of the carrier film 300.

After the display module DM is bent, the pad PD and the second jig ZG2 may move in a direction toward the first jig ZG1. The direction toward the first jig ZG1 may be substantially parallel to the third direction DR3. As the second jig ZG2 ascends, a contact area between the first target member TM1 and the second target member TM2 may increase bilaterally from the adhesive line CL. That is, the first target member TM1 may be in surface contact with the second target member TM2. The first target member TM1 and the second target member TM2 may be gradually attached to each other from a center portion thereof toward both sides thereof.

The carrier film 300 may be in contact with the pad PD, and the pad PD may press the carrier film 300, the display module DM, and the adhesive layer 150 to the third direction DR3. Accordingly, the shape of each of the carrier film 300, the display module DM, and the adhesive layer 150 may be changed to correspond to the shape of the pad PD. Then, the carrier film 300 may be fixed to the pad PD using the first pressure part 250. The pad PD and the second jig ZG2 may press the display module DM to the direction toward the first jig ZG1 such that the display module DM is laminated to the first target member TM1.

Figure 13E:
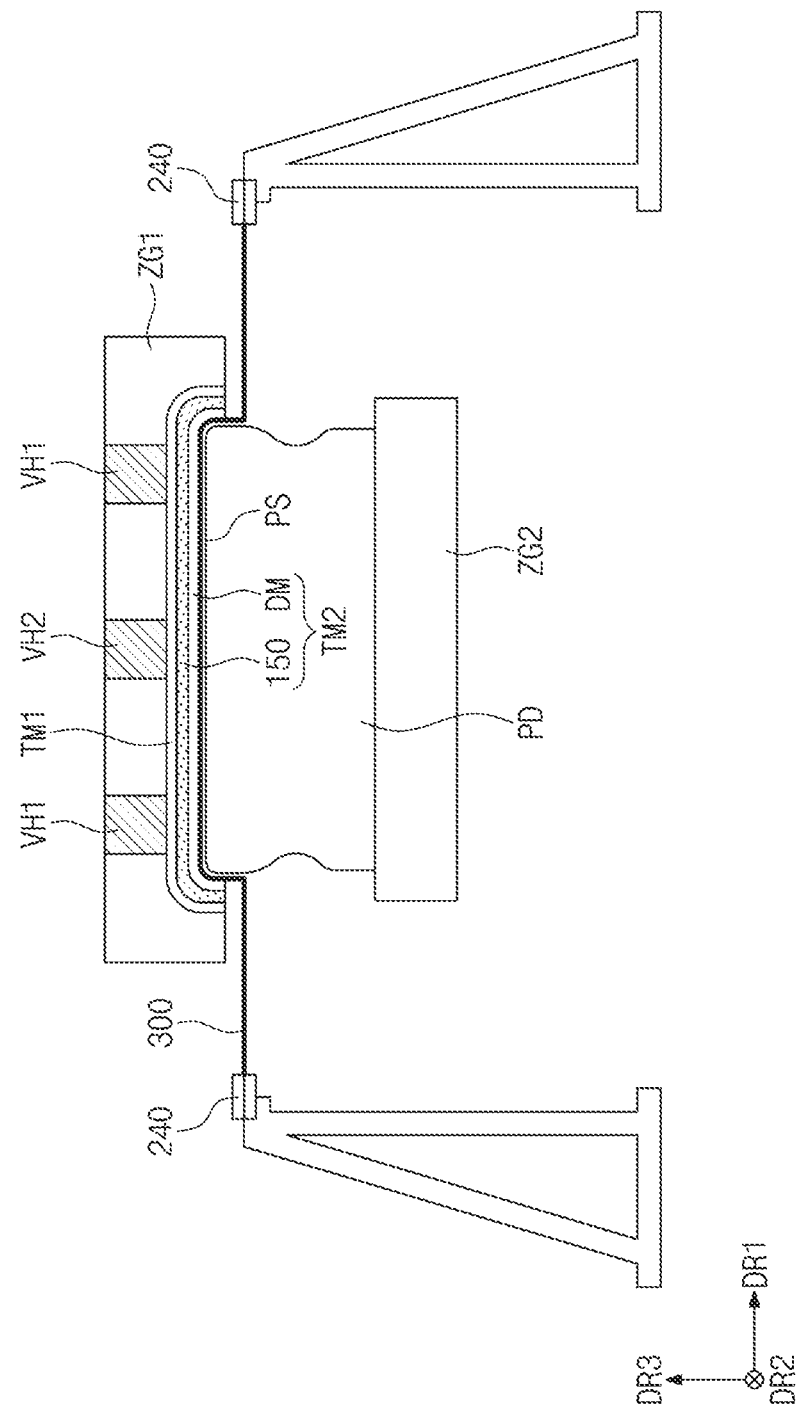

Referring to FIG. 13E, as the second jig ZG2 ascends, the first target member TM1, the second target member TM2, and the upper surface PS of the pad PD may completely overlap each other. In addition, the upper surface PS of the pad PD may have a curved shape to correspond to the shape of the first target member TM1 or the shape of the display module DM. When the first target member TM1 and the second target member TM2 are completely attached to each other, the lamination process is completed.

Differently from the embodiments of the invention, when the lamination target is changed or defects occur due to the degree of the pressure by the pad, a technician may manually reset the lamination apparatus. In this case, a probability of error occurrence increases due to the manual measurement, it takes too much time in measuring, and when the height of the pad is lowered due to the repeated attachment and detachment of the pad, it may not be possible to monitor a quality of products.

According to the invention, even though the lamination target is changed or the shape of the pad is changed due to the repeated use of the pad, the zero data (or the zero value) may be reset based on the vacuum value. The zero data may be automatically set by the controller of the lamination apparatus, and thus this may be systematically performed in conjunction with a system, a management accuracy for the zero data may be improved. That is, the lamination apparatus may be automatically set based on the vacuum value. Accordingly, the error of a setting value, for example, the zero data, may be reduced, and the time desired to set the lamination apparatus may be reduced compared with the time desired when the lamination apparatus is set manually. In addition, it is possible to correct the Z-axis value by reflecting the change in the height of the pad caused by the repeated use of the pad.

In addition, according to the disclosure, as the zero data are set based on the vacuum value, the error of the zero data may be reduced. Accordingly, defects related to the degree of the pressure, e.g., a panel crack, a gray spot, a bubble, etc., may be reduced or removed.

Although the embodiments of the invention have been described, it is understood that the invention should not be limited to these embodiments but various changes and modifications may be made by one ordinary skilled in the art within the spirit and scope of the invention as hereinafter claimed. Therefore, the disclosed subject matter should not be limited to any single embodiment described herein, and the scope of the invention shall be determined according to the attached claims.

What is claimed is:

1. A lamination apparatus comprising:
   a first jig comprising an accommodating recess defined by a bottom surface through which a plurality of vacuum holes is defined and side surfaces bent and extending from the bottom surface;
   a cover member in which an opening exposing at least one vacuum hole among the plurality of vacuum holes and having a width wider than a width of the at least one vacuum hole is defined;
   a second jig disposed to face the first jig;
   a pad disposed on the second jig; and
   a controller which sets zero data based on a vacuum value measured from the at least one vacuum hole.

2. The lamination apparatus of claim 1, wherein the second jig ascends in a first direction until the pad contacts the at least one vacuum hole, and the controller sets information about a position of the first jig and a position of the second jig when the pad contacts the at least one vacuum hole as the zero data.

3. The lamination apparatus of claim 1, wherein the plurality of vacuum holes comprises a first vacuum hole which overlaps the cover member and a second vacuum hole which does not overlap the cover member, and the controller sets the zero data based on the vacuum value measured in the second vacuum hole.

4. The lamination apparatus of claim 3, wherein the pad comprises a protruded upper surface, and the second vacuum hole contacts a protruded portion of the pad.

5. The lamination apparatus of claim 1, wherein the cover member includes a tape, and the tape is attached to remaining vacuum holes of the plurality of vacuum holes except the at least one vacuum hole among the vacuum holes.

6. The lamination apparatus of claim 1, wherein the cover member is a setting window through which an opening is defined, the setting window is attached to the bottom surface of the first jig, and the at least one vacuum hole overlaps the opening and is not covered by the setting window.

7. The lamination apparatus of claim 1, wherein the controller controls a movement of the first and second jigs, controls an operation of the plurality of vacuum holes, and controls a measurement of vacuum values from the plurality of vacuum holes.

8. The lamination apparatus of claim 1, wherein the controller comprises:
   a processor which measures the vacuum value from the at least one vacuum hole and generates a plurality of data based on the vacuum value; and
   a determinator which resets the zero data based on the data.

9. The lamination apparatus of claim 1, wherein the controller further comprises a memory which stores the vacuum value and vacuum saturation data, and the vacuum value is measured multiple times according to a relative position between the first jig and the pad, and the vacuum saturation data are the vacuum value obtained when the vacuum value measured multiple times have constantly a same value.

10. The lamination apparatus of claim 9, wherein the memory further stores vacuum reference data, and the vacuum reference data are obtained by correcting the vacuum saturation data with a predetermined value.

11. The lamination apparatus of claim 10, wherein the memory further stores a Z-axis value which is a height value of an upper surface of the pad when the vacuum value is changed from a value corresponding to the vacuum reference data to another value.

12. The lamination apparatus of claim 11, wherein the memory further stores the zero data, and the zero data are the Z-axis value or a corrected Z-axis value obtained by correcting the Z-axis value.

13. A method of manufacturing a display device, comprising:
   setting zero data of a lamination apparatus; and
   laminating a first target member to a second target member using the lamination apparatus, the setting the zero data of the lamination apparatus comprising:
      attaching a cover member to a first jig through which a plurality of vacuum holes is defined to expose at least one vacuum hole among the plurality of vacuum holes;
      moving a second jig facing the first jig and a pad disposed on the second jig toward the plurality of vacuum holes; and
      setting the zero data based on a vacuum value measured from the at least one vacuum hole,
   wherein an opening exposing the at least one vacuum hole and having a width wider than a width of the at least one vacuum hole is defined in the cover member.

14. The method of claim 13, wherein the cover member comprises a tape, and the attaching the cover member comprises attaching the tape to remaining vacuum holes except the at least one vacuum hole among the plurality of vacuum holes.

15. The method of claim 13, wherein the cover member is a setting window through which an opening is defined, and the attaching the cover member comprises:
- aligning the setting window such that the opening the setting window overlaps the at least one vacuum hole; and
- attaching the setting window to a bottom surface of the first jig.

16. The method of claim 13, wherein the setting the zero data comprises:
- generating vacuum reference data based on the vacuum value measured from the at least one vacuum hole; and
- generating a Z-axis value based on the vacuum reference data.

17. The method of claim 16, further comprising setting the Z-axis value or a corrected Z-axis value obtained by correcting the Z-axis value as the zero data, wherein the Z-axis value is a height value of an upper surface of the pad when the vacuum value is changed from a value corresponding to the vacuum reference data to another value.

18. The method of claim 16, wherein the generating the vacuum reference data comprises:
- measuring the vacuum value multiple times when a distance between the first jig and the pad is equal to or smaller than a predetermined distance;
- setting the measured value as vacuum saturation data when the vacuum value measured multiple times have constantly the same value; and
- correcting the vacuum saturation data with a predetermined value to generate the vacuum reference data.

19. The method of claim 16, wherein the generating the Z-axis value comprises:
- performing a first moving operation to move the second jig to a first direction until the vacuum value becomes a value corresponding to the vacuum reference data;
- performing a second moving operation following the first moving operation to move the second jig to the first direction until the vacuum value is changed from the value corresponding to the vacuum reference data to another value; and
- generating a height value of an upper surface of the pad as the Z-axis value when the vacuum value is changed from the value corresponding to the vacuum reference data to another value.

20. The method of claim 19, wherein a moving speed of the second jig in the first moving operation is different from a moving speed of the second jig in the second moving operation.

* * * * *